United States Patent [19]
Wendell

[11] Patent Number: 5,936,892
[45] Date of Patent: Aug. 10, 1999

[54] MEMORY CELL DC CHARACTERIZATION APPARATUS AND METHOD

[75] Inventor: Dennis L. Wendell, Pleasanton, Calif.

[73] Assignee: Advanced Micro Devices, Inc., Sunnyvale, Calif.

[21] Appl. No.: 08/938,722

[22] Filed: Sep. 26, 1997

Related U.S. Application Data

[60] Provisional application No. 60/027,329, Sep. 30, 1996.

[51] Int. Cl.$^6$ .................................................. G11C 16/04
[52] U.S. Cl. ............................... 365/189.03; 365/189.02; 365/185.19; 365/156
[58] Field of Search .............................. 365/156, 189.02, 365/185.19, 189.03

[56] References Cited

U.S. PATENT DOCUMENTS

| | | | |
|---|---|---|---|
| 4,975,877 | 12/1990 | Bell | 365/189.01 |
| 5,276,647 | 1/1994 | Matsui et al. | 365/201 |
| 5,422,852 | 6/1995 | Houston et al. | 365/201 |
| 5,463,585 | 10/1995 | Sanada | 365/201 |
| 5,517,448 | 5/1996 | Liu | 365/185.11 |
| 5,748,533 | 5/1998 | Dunlap et al. | 365/185.19 |

FOREIGN PATENT DOCUMENTS

| | | |
|---|---|---|
| 0 318 363 A1 | 5/1989 | European Pat. Off. |
| 0 411 594 A2 | 2/1991 | European Pat. Off. |
| 0 773 550 A2 | 5/1997 | European Pat. Off. |
| 40 22 153 A1 | 1/1991 | Germany. |
| 2 297 182 | 7/1996 | United Kingdom. |

OTHER PUBLICATIONS

Sharma, A., "Semiconductor Memories: Technology, Testing, and Reliability," IEEE Solid–State Circuits Council, IEEE Press, New York, NY, 1997, pp. 222–247.

Seevinck, E., et al., "Static–Noise Margin Analysis of MOS SRAM Cells," IEEE Journal of Solid–State Circuits, vol. sc–22, No. 5, Oct. 1987, pp. 748–754.

Hall, E., et al., "A Structured Approach for Failure Analysis of a 256K BiCMOS SRAM," ISTFA International Symposium for Testing and Failure Analysis; Conference Proceedings; ASM Int., Materials Park, OH, Nov. 1989, pp. 167–176.

*Primary Examiner*—David Nelms
*Assistant Examiner*—VanThu Nguyen
*Attorney, Agent, or Firm*—Skjerven, Morrill, MacPherson, Franklin & Friel, L.L.P.; William W. Holloway

[57] ABSTRACT

A memory array test and characterization capability is disclosed which allows DC characterization of the memory cells, the bit lines, and the sense amplifiers. A row decoder is provided which includes a static wordline select signal to disable self-resetting logic within the row decoder and allow the word line to remain active for a user-controlled length of time. An analog wordline drive capability allows the active wordline to be driven to a user-controllable analog level. Direct access to a pair of bitlines is provided by a multiplexer which is statically decoded to couple a pair of isolated terminals to the respective bitlines within the decoded column. This allows DC voltage levels to be impressed upon each of the two bitlines within the decoded column and/or the two bitline currents to be sensed. A separate power connection is provided for the memory array which allows operating the memory array at a different power supply voltage than the remainder of the circuit. By utilizing one or more of these features together, several tests of the memory array may be performed, including characterizing the DC transfer function of the memory cells, the standby power of the memory array, the static noise margin of the memory cells, the alpha particle susceptibility of the memory cells as a function of memory cell supply voltage, the offset voltage of bitline sense amplifiers, and others.

10 Claims, 17 Drawing Sheets

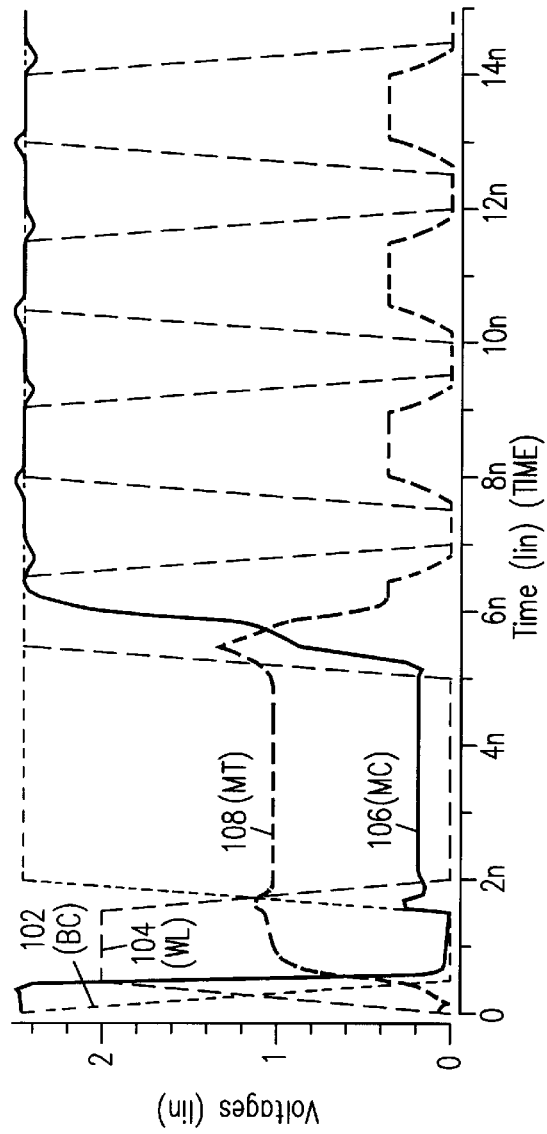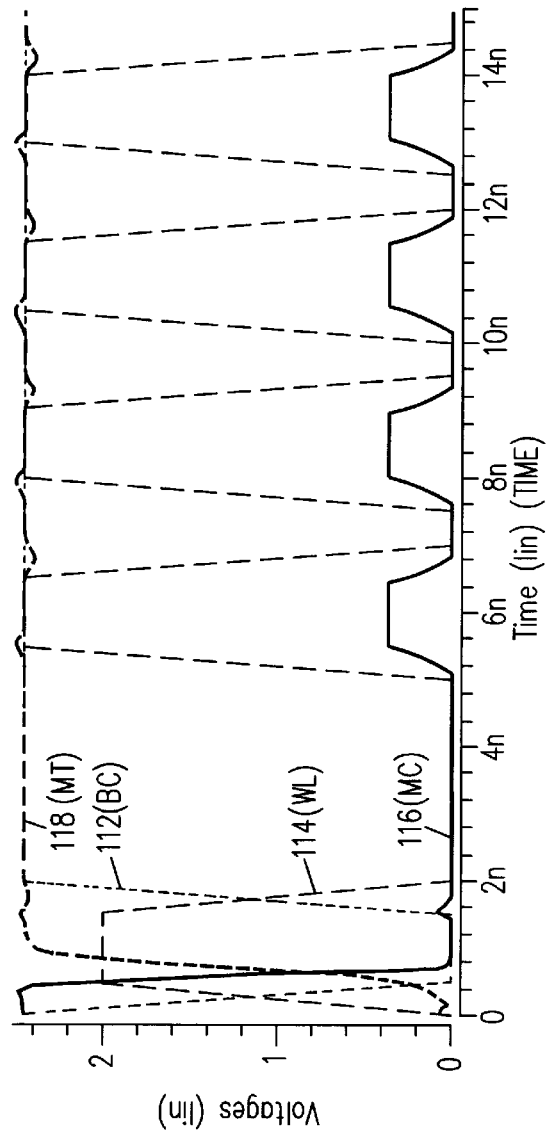
FIG. 4A
FIG. 4B

MEMORY CELL DC CHARACTERIZATION APPARATUS AND METHOD

CROSS-REFERENCE TO RELATED APPLICATION

This application claims the benefit under 35 U.S.C. § 119(e) of U.S. Provisional Application Serial No. 60/027,329, filed Sep. 30, 1996, entitled "An X86 Microprocessor with Multi-Media Extensions" and naming Donald A. Draper, Matthew P. Crowley, John Holst, John G. Favor, Amos Ben-Meir, Jeffery E. Trull, Raj Khanna, Dennis Wendell, Ravikrishna Cherukuri, Joe Nolan, Hamid Partovi, Mark Johnson, and Tom Lee as inventors, which provisional application discloses an exemplary embodiment of the present invention and which is incorporated herein by reference in its entirety.

This application is related to copending, commonly assigned, concurrently-filed U.S. patent application Ser. No. 08/938,257, which names Dennis L. Wendell as inventor and is entitled "Memory Array Test and Characterization Using Isolated Memory Cell Power Supply," which application is incorporated herein by reference in its entirety.

This application is related to copending, commonly assigned, concurrently-filed U.S. patent application Ser. No. 08/938,732, which names Dennis L. Wendell as inventor and is entitled "Data Retention Test for Static Memory Cell," which application is incorporated herein by reference in its entirety.

This application is related to copending, commonly assigned, concurrently-filed U.S. patent application Ser. No. 08/938,993, which names Dennis L. Wendell as inventor and is entitled "Memory Array Sense Amplifier Test and Characterization," which application is incorporated herein by reference in its entirety.

BACKGROUND OF THE INVENTION

1. Field of the Invention

The present invention is related to semiconductor memory devices, and more particularly to the test and characterization of static memory cells and related interface circuits.

2. Description of the Related Art

A memory array which is fabricated in an integrated circuit may be functionally tested using a variety of well known algorithms. These tests may be conducted to provide thorough test coverage under margined operating conditions, and memory arrays having one or more failing memory cells may be rejected (or alternatively, replaced by a redundant memory element). Unfortunately, it is frequently very difficult to determine the cause of a failing memory cell, a failing column, or a failing row within the memory array, especially if the memory array is embedded within a large integrated circuit such as a microprocessor.

Various methods have been used to try to detect the underlying causes of failing memory arrays, as well as to determine the operating margins of the memory array. Many methods require significant inferences to be drawn, based on a series of test results using a variety of test patterns and operating conditions. But without direct access to internal circuit nodes, frequently such inferences are inconclusive. Microprobing has been used to afford access to internal bit lines and word lines of a memory array, but this is a difficult and very time consuming procedure, and even more so at environmental extremes. Moreover, as line widths have become smaller, and as additional layers of metal interconnect frequently overlay the nodes of interest, microprobing has effectively lost much of its previous viability as a diagnostic and characterization tool.

Nonetheless, larger and larger memory arrays are being integrated into a variety of integrated circuits. In many such circuits, over half of the transistors used in the circuit are used to implement the memory array. Characterization of the memory array is therefore increasingly important. Improved methods are needed, especially for those memory arrays which may be incorporated or embedded within large, sophisticated integrated circuits such as microprocessors.

The stability of both resistor-load and full CMOS (PMOS loads) SRAM memory cells is investigated, and expressions for static noise margin derived, in Seevinck, et al., "Static-Noise Margin Analysis of MOS SRAM Cells," IEEE Journal of Solid-State Circuits, Vol. SC-22, No. 5, pp. 748–54 (October, 1987).

A systematic approach for failure analysis for yield enhancement and reliability improvement for BiCMOS SRAM memory cells is described in Hall, et al., "A Structured Approach for Failure Analysis of a 256K BiCMOS SRAM," Conference Proceedings of The Failure Analysis Forum for Microelectronics and Advanced Materials, pp. 167–76 (November, 1989).

SUMMARY OF THE INVENTION

A memory array test and characterization capability is provided which allows DC characterization of the memory cells, the bit lines, and the sense amplifiers. In one embodiment, a row decoder is provided which includes a static wordline select signal to disable self-resetting logic within the row decoder and allow the word line to remain active for a user-controlled length of time. An analog wordline drive capability allows the active wordline to be driven to a user-controllable analog level. This is accomplished, in one embodiment, by connecting the "VDD" and N-well of the final PMOS stage of the row decoder to an isolated terminal which is normally connected to VDD when assembled, but which is independently available prior to packaging. Direct access to a pair of bitlines may be provided by a multiplexer which is statically decoded, using a test address, to couple a pair of isolated terminals to the respective bitlines within the decoded test column. This allows DC voltage levels to be forced or sensed on each of the two bitlines within the decoded test column and/or the two bitline currents to be forced or sensed. These isolated terminals are independently accessible prior to packaging, but may optionally be inaccessible once assembled. A separate power supply terminal may be provided for the memory array which allows operating the memory cells at a different power supply voltage than the remainder of the circuit. Such an isolated power supply terminal is independently available prior to packaging, and may be normally connected to VDD when assembled. By utilizing one or more of these features together, several very important tests of the memory array may be performed, including characterizing the DC transfer function of the memory cells, the standby power of the memory array, the static noise margin of the memory cells, the alpha particle susceptibility of the memory cells as a function of memory cell supply voltage, the offset voltage of bitline sense amplifiers, and others. C4 solder bumps or bond pads may be used to implement such isolated terminals. Both "Go/Nogo" testing of a few exemplary memory cells and sense amplifiers may be performed, as well as full array characterization to map statistical variations of these parameters across the entire array.

In one embodiment of the present invention in an integrated circuit incorporating a static read/write memory array, a method of characterizing a memory cell within the memory array includes providing a multiplexer in the integrated circuit for coupling a respective pair of isolated terminals to a selected pair of complementary bit lines, providing memory array support circuitry connected to the respective bitlines which selectively presents a high-impedance to the selected pair of bit lines, providing a row decoder for selectively statically driving a selected word line to an externally controllable analog voltage, presenting a first pair of voltage conditions respectively on the pair of isolated terminals, thereby driving the selected pair of bit lines to the first pair of voltage conditions, ramping the externally controllable voltage through a particular voltage range; and measuring current flow from one of the bit lines into the selected memory cell.

In another embodiment of the present invention, an integrated circuit incorporating a static read/write memory array includes a multiplexer for coupling a respective pair of isolated terminals to a selectable pair of complementary bit lines, memory array support circuitry connected to the respective bitlines which selectively presents a high-impedance to a selected pair of bit lines, and a row decoder for selectively statically driving a selected word line to an externally controllable analog voltage.

Other advantages and features of the invention and other embodiments thereof are described in the detailed description below.

BRIEF DESCRIPTION OF THE DRAWINGS

The present invention may be better understood, and its numerous objects, features, and advantages made apparent to those skilled in the art by referencing the accompanying drawings.

FIGS. 3A, 3B, 4A, 4B, 5A and 5B show voltage waveforms which illustrate several test sequences performed upon the memory cell shown in FIG. 2.

The use of the same reference symbols in different drawings indicates similar or identical items.

DESCRIPTION OF THE PREFERRED EMBODIMENT(S)

Figure 1:
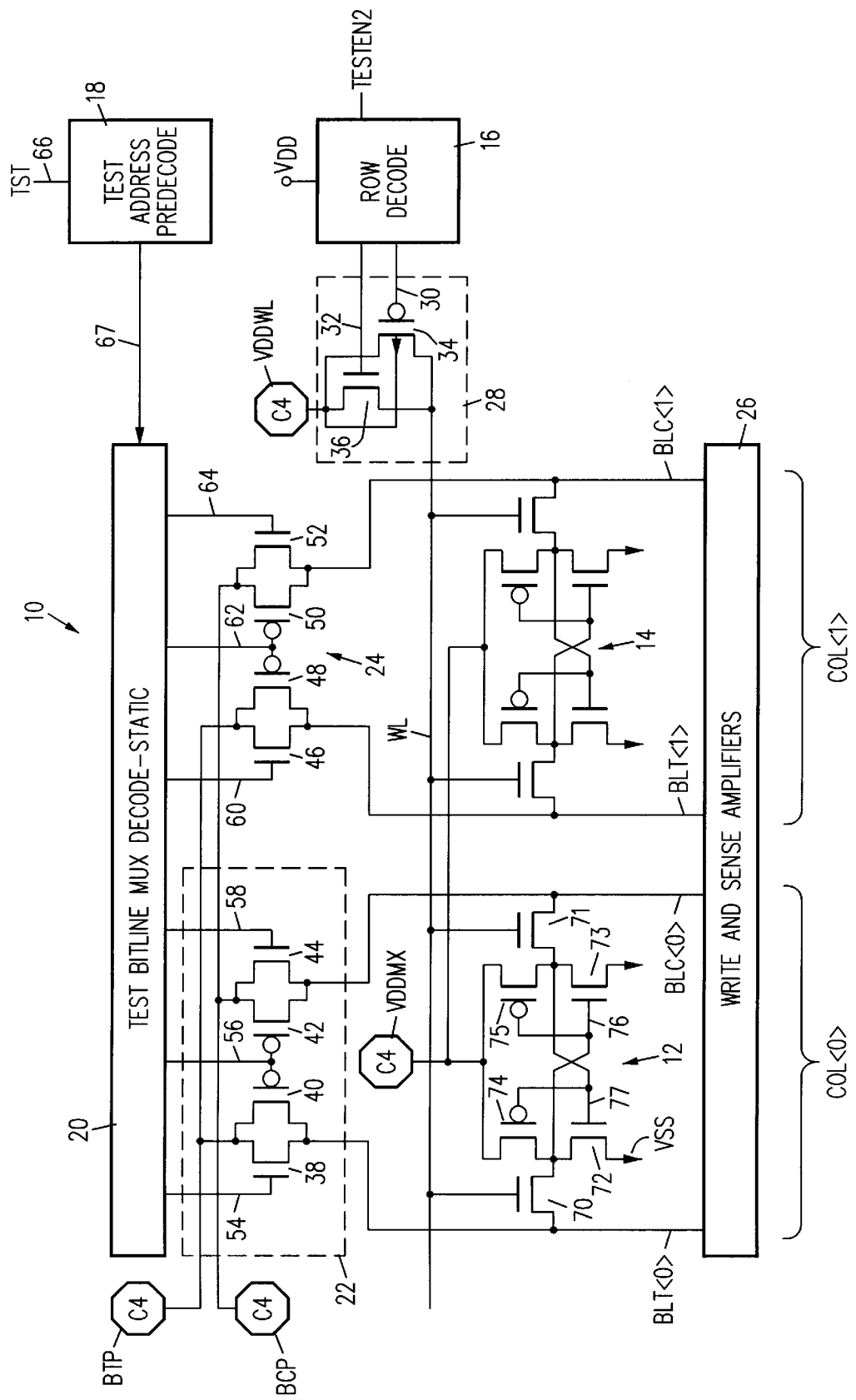
FIG. 1 is a block diagram representing a memory array in accordance with the present invention.

Referring now to FIG. 1, a static memory array 10 is shown having features in accordance with the present invention. For clarity only two columns and one row of memory array 10 are shown, but it is understood that the circuits depicted in FIG. 1 are extendible to memory arrays having larger numbers of both rows and/or columns, as is well known in the art. Each of the two columns respectively includes a true and a complement bit line, and the row includes a single word line. In particular the first column COL<0> includes a true bit line BLT<0> and includes complement bit line BLC<0>. The second column COL<1> includes true bit line BLT<1> and complement bit line BLC<1>. A single word line WL couples memory cells 12 and 14, respectively, to column COL<0> and column COL<1>. Memory cell 12 includes P-channel load transistors 74 and 75, N-channel driver transistors 72 and 73, and N-channel access transistors 70 and 71. Load transistors 74 and 75, respectively, couple a true internal node 76 and a complement internal node 77 of the memory cell 12 to an array VDDMX node. Transistors 72 and 73 couple the internal true and complement memory cell nodes 76 and 77, respectively, to VSS. The gate terminal of each of these transistors 72 and 73 is cross-coupled to the drain terminal of the other. The access transistors 70 and 71, respectively, couple internal nodes 76 and 77 to the true bit line BLT<0> and complement bit line BLC<0>, respectively, when enabled by a word line WL. Memory cell 12 is commonly referred to as a 6T CMOS memory cell, and is well known in the art. Memory cell 14 is identical to memory cell 12 and is located within column COL<1> and is accessed using the word line WL, and the true bit line BLT<1> and complement bit line BLC<1>. Write and sense amplifiers 26 are shown connected to both columns COL<0> and COL<1>, and include circuitry for writing and reading each of the memory cells within the memory array 10.

A row decode 16 receives row address signals (not shown) and decodes a single selected row for both reading and writing. A transfer gate 28 forms part of the row decoder and allows driving a selected row line to a voltage different than the VDD voltage otherwise powering the row decoder 16. The transfer gate 28 includes an N-channel enhancement mode MOSFET 36 and P-channel enhancement mode MOSFET 34 which are connected in parallel, coupling the word line WL to an isolated C4 solder bump terminal VDDWL. The gate terminal 30 of P-channel transistor 34 and the gate terminal 32 of N-channel transistor 36 are complementary signals generated by row decode 16. To activate word line WL, gate terminal 30 is brought low and gate terminal 32 is brought high by row decode 16. With both transistors 34 and 36 of the transfer gate 28 turned on, the word line WL is brought to the voltage presented to isolated C4 terminal VDDWL. The voltage presented to this terminal VDDWL may be tied to the standard VDD voltage used for normal operation of the memory array 10, but may also be tied for test purposes to voltages other than the standard VDD. The N-well of transistor 34 is also tied to isolated C4 terminal VDDWL, as is indicated in FIG. 1, which allows the voltage applied to terminal VDDWL to exceed other VDD levels applied elsewhere to the integrated circuit within which memory array 10 is implemented. To inactivate the word line WL, row decode 16 includes a pull-down transistor (not shown) which brings the voltage of word line WL back to VSS. Row decode 16 also turns off the transfer gate 28 by driving gate terminal node 30 high and driving gate terminal node 32 low. In a larger, array other word lines are driven by similar circuits within row decode 16 such that at any one time, one word line is selected and driven high (assuming VDDWL is at a high voltage), while all remaining word lines are held to an inactive VSS level. For large arrays, the isolated C4 terminal VDDWL may exist as several isolated C4 terminals which connect, in convenient groups, portions of the row decode 16 corresponding to groups of word lines within the memory array 10. This eases layout concerns and affords a low resistance, low inductance path to the terminal VDDWL. Additionally, internal bypass capacitors may be implemented in the row deocde 16 to help source the dynamic current needed to charge a selected wordline.

The array VDD node for each of the memory cells 12 and 14 is connected to an isolated C4 terminal VDDMX. This isolated terminal VDDMX provides power to the memory cells 12 and 14 which is independent of any other power consumed within the integrated circuit. For large arrays, the array VDD node for each of the memory cells may be connected in convenient groups to a plurality of independent C4 solder bumps which, for the purposes of this description, collectively taken together shall be referred to as isolated C4 terminal VDDMX.

The memory array 10 includes circuitry for providing direct access to a selected bit line pair within the memory array 10. A particular column is selected by test address signals (not shown) received by test address predecode 18, which then drives predecode signal 67 to a test bit line mux decode 20 which decodes and drives a selected output high to enable the particular column located at the test address. The selected output of the test bit line mux decode 20 enables a transfer circuit which couples a respective bit line pair to a pair of test pads. For example, mux circuit 22, when active, couples bit line BLT<0> to test pad BTP through the transfer gate formed by transistors 38 and 40. Moreover, mux circuit 22 couples complement bit line BLC<0> to test pad BCP through the transfer gate formed by transistors 42 and 44. Mux circuit 22 is enabled when the test bit line mux decode 20 drives nodes 54 and 58 high and drives node 56 low. Only one such mux circuit 22 is enabled at any given time, and one is enabled only during a test mode. Normally all of the outputs of test bit line mux decode 20 remain inactive, thereby turning off all such mux circuits 22. This de-couples any effect of test pads BTP and BCP from detrimentally influencing the operation of any of the bit line pairs within memory array 10. A second mux circuit 24 is shown coupling bit lines BLT<1> and BLC<1>, respectively, to test pad BTP and BCP through the transfer gate formed by transistors 46 and 48 and by the transfer gate formed by transistors 50 and 52. The mux circuit 24 is enabled, in like fashion to that described for mux circuit 22, by driving select nodes 60 and 64 high and by concurrently driving select node 62 low.

Test pads BTP and BCP are preferably isolated C4 solder bumps, although they may easily be implemented as isolated bonding pads. Likewise, the isolated C4 terminals VDDWL and VDDMX may also be implemented as isolated bonding pads, but are preferably implemented as C4 solder bumps, as indicated in FIG. 1. The test bit line mux decode 20 is enabled when in an appropriate test mode by the test enable signal TST conveyed on node 66, as will be discussed below.

The test address predecode 18 and the test bit line mux decode 20 are used only in a slow speed test mode, and consequently the performance of these two circuits is not demanding. Therefore, a variety of suitable circuits may be utilized which are well known in the art. Preferably test address predecode 18 is implemented as a group of 2-input/4-output predecode stages implemented using a nand-invert structure. Each predecode block receives two addresses and generates four predecode signals, one of which is activated in accordance with the address states presented thereto. These predecode signals are communicated via bus 67 to test bit line mux decode 20, which is also preferably implemented as a four input nand structure followed by two inverters, one to generate the active high output at each column and one to generate the required active low output at each column. This particular implementation is relatively layout efficient and performs robustly. Since the test bit line mux decode 20 may be utilized to characterize and debug a memory array 10 which is failing and which may include a catastrophic failure mechanism, such as severe poly overetch or other processing conditions which might cause gross malfunction within a memory array, the layout of both test bit line mux decode 20 and test predecode 18 are preferably made to much looser tolerances than what is used elsewhere within the memory array 10. This is done in an attempt to preserve the functionality of the diagnostic circuits, even when the memory cells within the memory array may be severely misprocessed in such a fashion that would otherwise render a similarly laid-out diagnostic circuit to likewise fail.

By implementing these various isolated terminals (VDDWL, VDDMX, BTP and BCP) as isolated C4 solder bumps, each of these terminals is easily available during wafer level testing such as functional testing for wafer sort. Such testing may include the application of a variety of voltages, on each of these four isolated terminals, other than the normal VDD level which is used to power the remainder of the integrated circuit, including the memory array 10, under normal conditions. However, when the integrated circuit is packaged, each of the isolated C4 solder bumps may easily be connected to the normal VDD which powers the remainder of the device to provide a very low resistance and low inductance connection so that anomalous effects are not introduced by the presence of these features, nor without significant layout penalty to incorporate these features. Furthermore, the availability of the various tests may be then automatically disabled and rendered inaccessible to an end-user once the integrated circuit is packaged.

When enabled by enable signal TST, the test bit line mux decode 20 selects a multiplexer circuit (e.g., multiplexer circuit 22) which couples a bit line pair to a pair of isolated pads BTP and BCP. This allows, for example, forcing voltages onto each of the bit lines and/or sensing currents on each of the bit lines. For example, a voltage might be impressed or forced on bit line BLT<0> while sensing the current flow on bit line BLC<0>. Such a general capability to force voltages, to sense voltages, to force a current, and to sense a current, provides an extremely flexible test capability which can be used to characterize transistors within each of the memory cells within memory array 10, as well as to characterize sense amplifiers connected to each of the columns within memory array 10. These capabilities will be individually described below. The ability to force a voltage onto terminal VDDWL which is less than the VDD level provided to the remainder of the integrated circuit affords a beneficial data retention test capability which is particularly useful for functional testing and as will also be described below.

Data Retention Test—Single PMOS Open Drain

Figure 2:
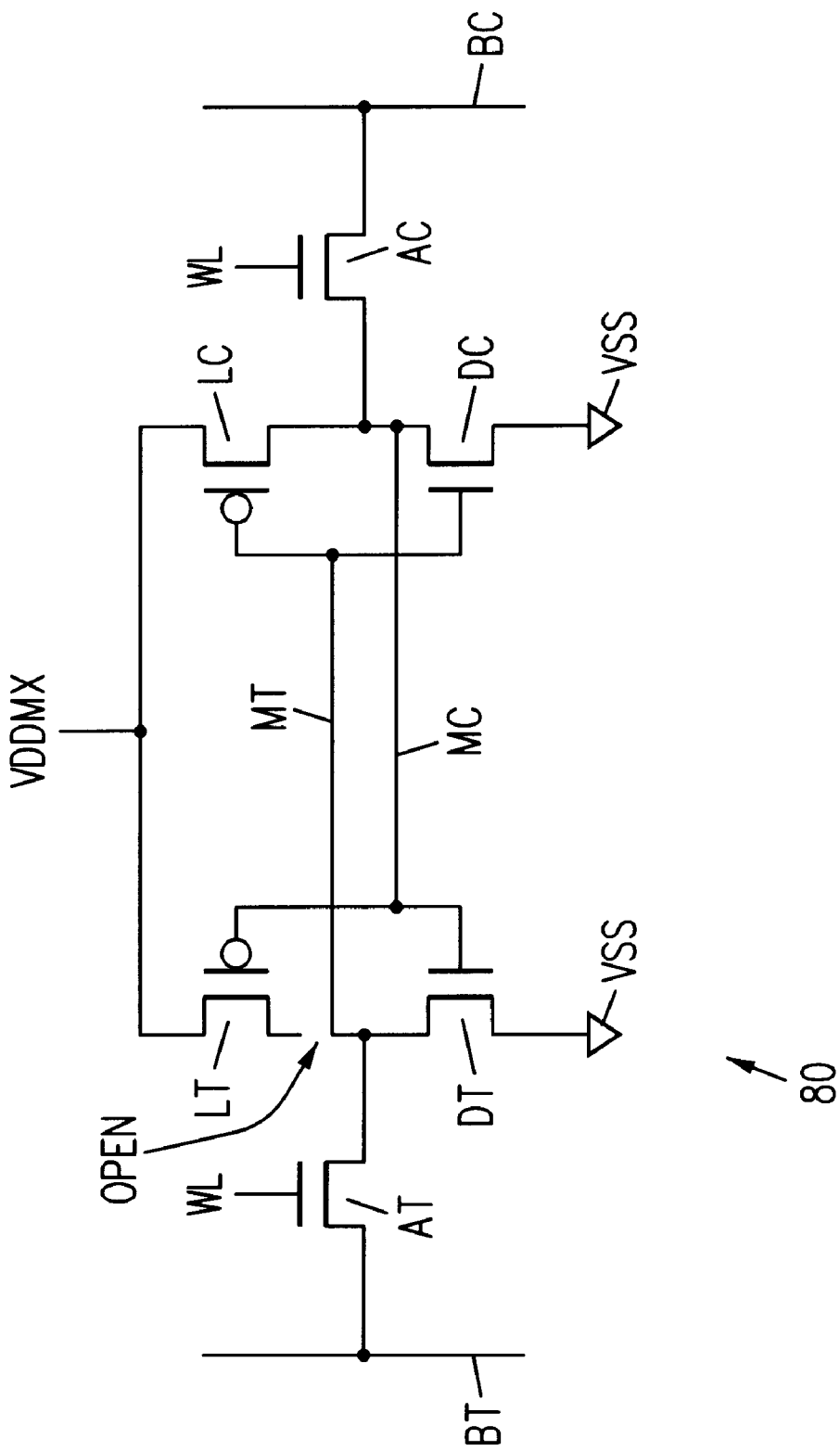
FIG. 2 is a schematic diagram of a memory cell within the memory array shown in FIG. 1, and which illustrates a failure mode (single open PMOS load device) which is testable in accordance with the present invention.

Referring now to FIG. 2, memory cell 80 represents a static memory cell representative of memory cells 12 and 14 within memory array 10, but which is indicated as having a manufacturing defect which results in one of the P-channel load devices being open. Bit lines BT and BC represent the true and complement bit lines for memory cell 80. Access transistors AT and AC couple the respective bit lines BT and BC to internal nodes MT and MC. Cross-coupled load devices LT and LC respectively couple internal nodes MT and MC to the array VDDMX, while cross-coupled driver transistors DT and DC, respectively, couple internal nodes MT and MC to VSS. A manufacturing defect causing the load device LT (the load device on the "true" side of the memory cell) to be non-conductive is indicated between the internal node MT and the drain terminal (unlabeled) of load device LT. Such an "open" defect causes load device LT to be non-conductive and prevents load device LT from pulling up internal node MT to the array VDDMX voltage. Such a defect may be caused by a missing contact (a contact which fails to open during a semiconductor etch process) or a break in an inter-connect element, such as polysilicon or metal, as well as other potential manufacturing causes.

A memory cell exhibiting a single PMOS open defect, such as that indicated in memory cell 80, is difficult to test because dynamically the internal node MT may be written to a degraded high voltage level by the access transistor AT, even without the assistance of load device LT. Under normal conditions such a level written on internal node MT is usually high enough to allow the memory cell 80 to be correctly read at least until the charge on internal node MT leaks off and causes a decaying of the voltage of internal node MT. At room temperature such leakage may be very low and the test times required can be exceedingly long. For most manufacturing test environments, this is unacceptable.

This kind of a defect may be tested using the circuitry shown in FIG. 1 by lowering the analog word line voltage compared to the memory array power supply voltage VDDMX. For example, assume that VDDM is equal to 2.9 volts and VDDWL equals 1.5 volts. Further assume that memory cell 80 is tested under these conditions and a logic 1 is written into the memory cell. To accomplish such a write, bit line BC is brought low while bit line BT remains high. Conduction through access transistor AC, even with only 1.5 volts on its gate, is sufficient to drive internal node MC low, thus turning off driver transistor DT. This allows access transistor AT to drive internal node MT high. But since the word line voltage is only equal to 1.5 volts, and since the written high level is a threshold voltage less than the word line voltage on access transistor AT, the high level written on internal node MT is equal to the word line voltage minus the access transistor AT threshold voltage. A representative value of such a degraded internal high voltage level written onto internal node MT is 0.7 volts. In a fully functioning memory cell, a near zero voltage on internal node MC will turn on load device LT which would restore the voltage level of internal node MT fully up to the VDDMX voltage. But since in memory cell 80 the load device LT is open and does not provide a conduction path to VDDMX, the degraded high voltage level (e.g. 0.7 volts) written onto internal node MT by the action of the degraded word line voltage is not restored to the full VDDMX voltage level. On the other side of the memory cell 80, load device LC remains somewhat conductive because its gate-to-source voltage exceeds the P-channel threshold voltage. Nonetheless, as long as the word line voltage is high, the conduction through access transistor AC into the low bit line BC is sufficient to hold the voltage of internal node MC at a low enough level to keep driver transistor DT off.

Figure 3A:
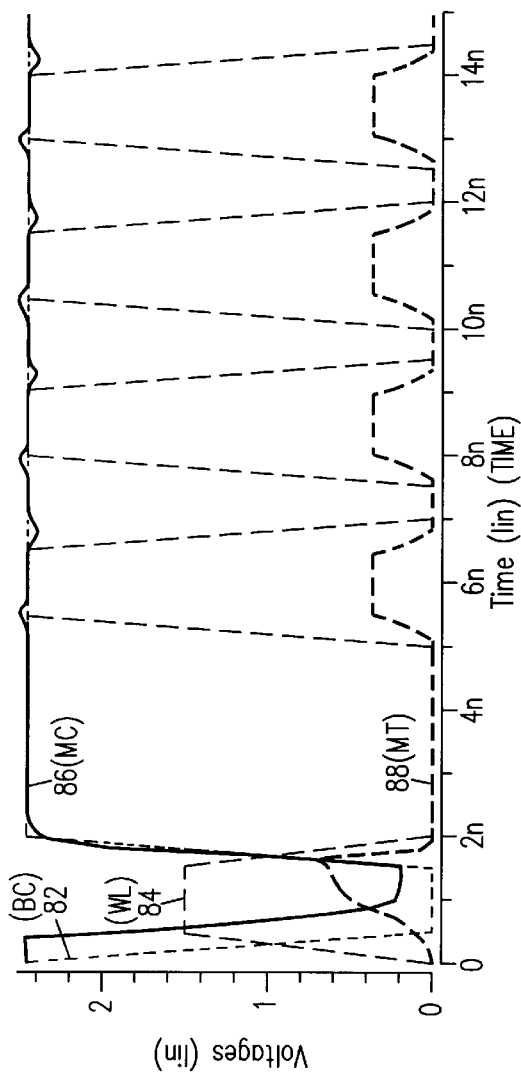

However, when the word line voltage goes low, the current through load device LC charges up the voltage of internal node MC which allows driver transistor DT to turn on. Consequently, the voltage dynamically stored on internal node MT is brought low by driver transistor DT, thus serving to turn on load device LC even more. Internal node MT is therefore brought all the way to ground (i.e., VSS), fully turning on load device LC, thereby causing internal node MC to be brought fully to the array voltage VDDMX. The low voltage on internal node MT turns off driver transistor DC and the cell is stable in this condition (which corresponds to a logic zero). In other words, by writing a degraded high voltage level into the memory cell on the internal node which lacks a load device, the memory cell flips states immediately upon the word line becoming inactive. A subsequent read cycle, even if performed immediately, can therefore easily detect this failing memory cell. Waveforms illustrating this operation are found in FIGS. 3A and 3B. FIG. 3A shows the operation of an abnormal memory cell having a PMOS open drain on the true side as is depicted in FIG. 2 in memory cell 80. The word line voltage shown in FIG. 3A is driven to 1.5 volts by connecting VDDWL to 1.5 volts while connecting VDDM to 2.5 volts. Waveform 82 represents the voltage on bit line BC in writing a low into the complement side of the memory cell 80 (which corresponds to writing a 1 into the true side). Waveform 84 represents the voltage of the word line which is shown rising to 1.5 volts. Internal node MC is shown at approximately one nanosecond as being brought low while waveform 88, which represents the voltage of the internal node MT within the memory cell 80, is shown as being written to a degraded high of approximately 0.7 volts. This condition is somewhat stable until the word line transitions back to zero volts at approximately two nanoseconds, whereupon the state of the memory cell 80 flips due to the conduction through load device LC resulting from the degraded high voltage level written onto internal node MT. Also shown in FIG. 3A are four subsequent read cycles using a full VDD level on the word line. This is done by changing the voltage applied to VDDWL from 1.5 to 2.5 volts between the time of the write cycle and the time of the first read cycle. As can be seen in FIG. 3A, the state of the memory cell does not change throughout these four memory read cycles.

Figure 3B:
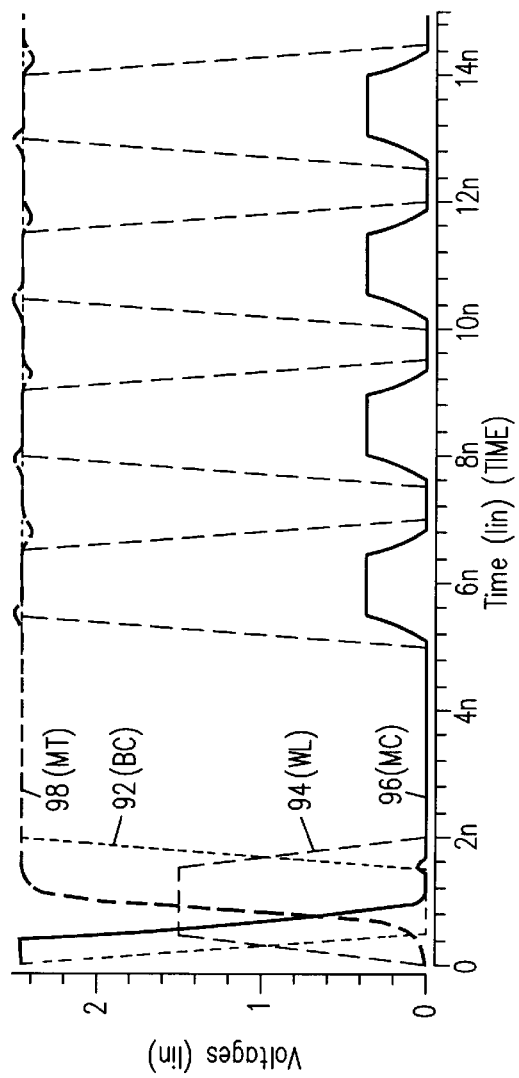

For comparison purposes, FIG. 3B illustrates the operation of a normal memory cell having both P-channel load devices LT and LC. Waveform 92 represents bit line BC which is driven low to write a low into the complement side of the memory cell. Waveform 94 represents the word line voltage again driven to a VDDWL of 1.5 volts. Waveform 96 represents the voltage of the internal node MC, and which shows the internal node MC correctly being brought low when the word line WL is high and the bit line BC is low. Likewise waveform 98, which represents the voltage of internal node MT, shows the true side of the memory cell being driven to a high level by both access transistor AT and, to drive the node to full VDDMX, by conduction through load device LT. Four subsequent read cycles using VDDWL equal to VDDMX are shown which causes no degradation or any other change of the voltages stored within the memory cell.

FIGS. 4A and 4B show a similar test sequence using a slightly higher voltage on the word line. FIG. 4A depicts an abnormal memory cell having a single PMOS open drain on the true side which is tested using a VDDWL of 2 volts. Bit line BC is brought low (waveform 102) while the word line WL is driven to 2 volts (waveform 104). A reasonably solid low level is written onto internal node MC (waveform 106) while an approximately 1.1 volt degraded high voltage level is written onto internal node MT (waveform 108). When the word line WL is brought low, the degraded high voltage level on internal node MT remains at substantially the same level due to the absence of a conduction path through load device LT (again, assuming a defective memory cell). Using the 2 volt word line level shown, the memory cell does not flip immediately when the word line is brought low, but as the following read cycle demonstrates, the first read cycle after the degraded write does cause the cell to invert states. Depending upon signal margins in the sense amp, this can easily be detected upon either the first or the second read cycle. Subsequent read cycles, as shown, cause no further degradation or other change on the internal nodes MT and MC.

For comparison purposes FIG. 4B illustrates a normal memory cell driven with identical waveforms as in FIG. 4A. Operation of the memory cell here is analogous to that shown in FIG. 3B. The internal node MC (waveform 116) is successfully brought low when both the word line WL (waveform 114) is driven high, and the bit line BC is driven low (waveform 112). Likewise, the internal node MT is driven high at substantially the same time due to the combined action of access transistor AT and load device LT.

Figure 5A:
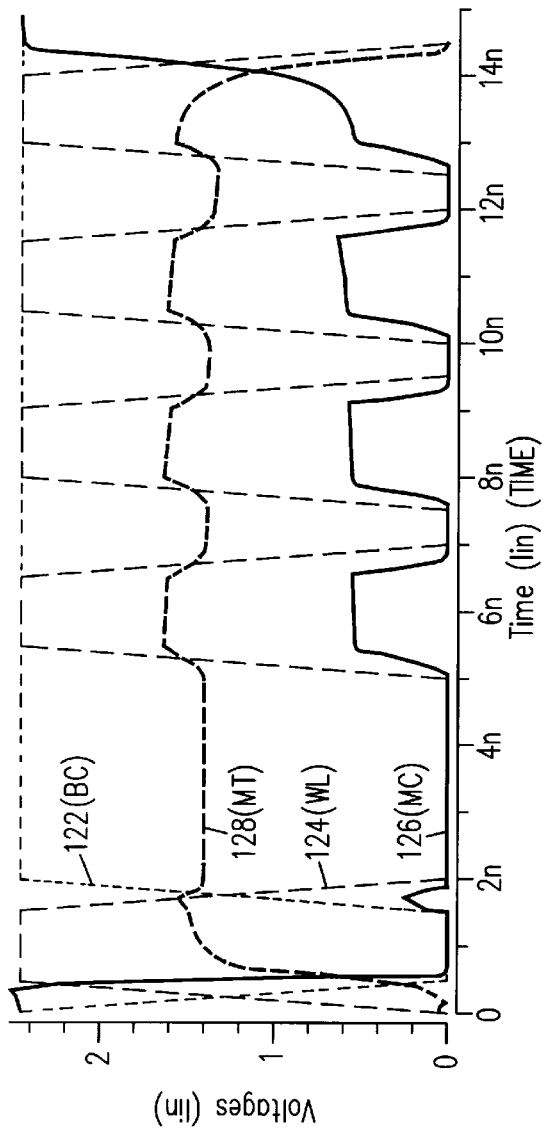
Figure 5B:
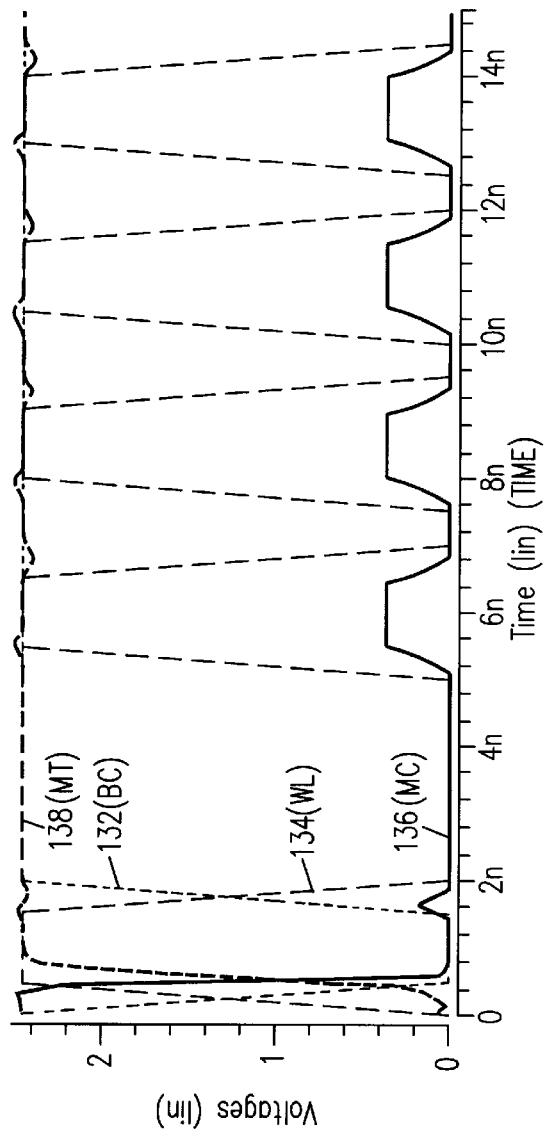

FIGS. 5A and 5B illustrate the operation of the defective memory cell 80 when the word line WL is driven to a full VDD (to the same VDD level as is VDDMX), and which indicates why the defect represented by memory cell 80 can be difficult and time consuming to test. The voltage of internal node MC is brought low (waveform 126) when both the word line WL is driven high (waveform 124) and the bit line BC is brought low (waveform 122). Because load device LT is non-conductive, the high level written by the access transistor AT onto internal node MT, even when the word line voltage is at a full VDD of 2.5 volts, is only approximately 1.2 volts. When the word line is brought low, this internal voltage is actually coupled downward somewhat at approximately two nanoseconds. Of note, each of the four following read cycles degrades by a small amount the voltage dynamically stored on the internal node MT. This occurs because as the memory cell 80 is read, the voltage of internal node MC rises from zero to an intermediate level determined by the beta ratio between access transistor AC and driver transistor DC, when the word line WL is turned on. This intermediate level is higher than usual because the high voltage on the gate terminal of driver transistor DC is not as high as it would normally be, and therefore transistor DC is not as conductive as it would normally be. Moreover, this intermediate level on internal node MC is high enough to cause a small amount of conduction (e.g., sub-threshold conduction) momentarily through driver transistor DT which degrades the voltage on internal node MT by a finite amount during each read cycle. Eventually the internal high level will be degraded far enough to where the memory cell flips states in a similar fashion to that described above. This is actually shown in FIG. 5A when the word line goes low at the end of the fourth read cycle following the write cycle. Such degradation may require hundreds of cycles before the memory cell changes states.

For comparison purposes, FIG. 5B illustrates the operation of a normal memory cell using a write cycle with the word line WL driven to a full VDD level. The internal node MC (waveform 136) is written low or brought low when both the voltage on the word line WL (waveform 134) is driven high and the bit line BC (waveform 132) is brought low. Likewise, the internal node MT is driven high at substantially the same time by the combined action initially of access transistor AT and load device LT, and, of course, ultimately by just the action of load device LT.

Data Retention Test—Double PMOS Open Drain

Figure 6:
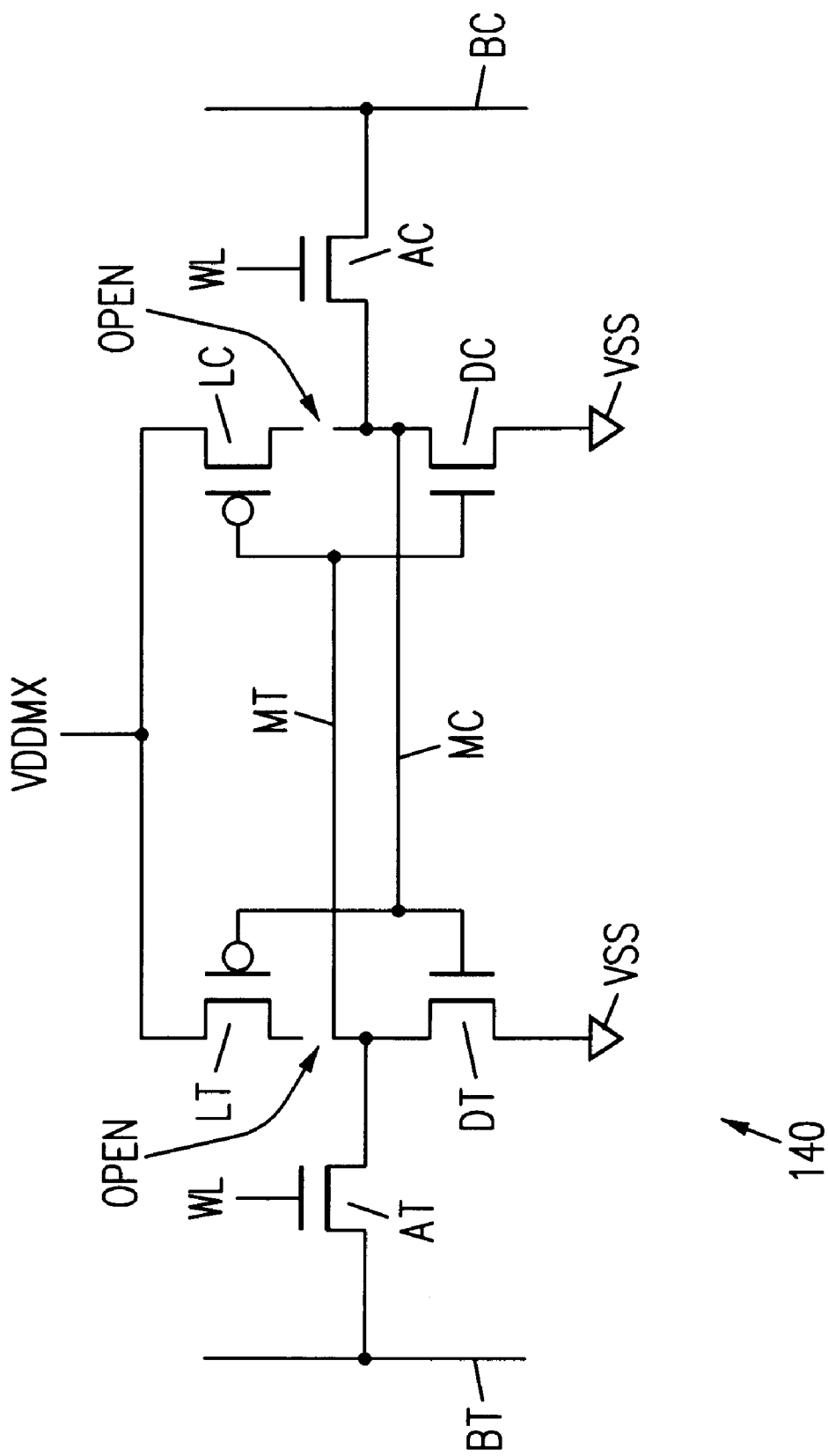
FIG. 6 is a schematic diagram of a memory cell within the memory array shown in FIG. 1, and which illustrates a second failure mode (double open PMOS load device) which is testable in accordance with the present invention.
Figure 7A:
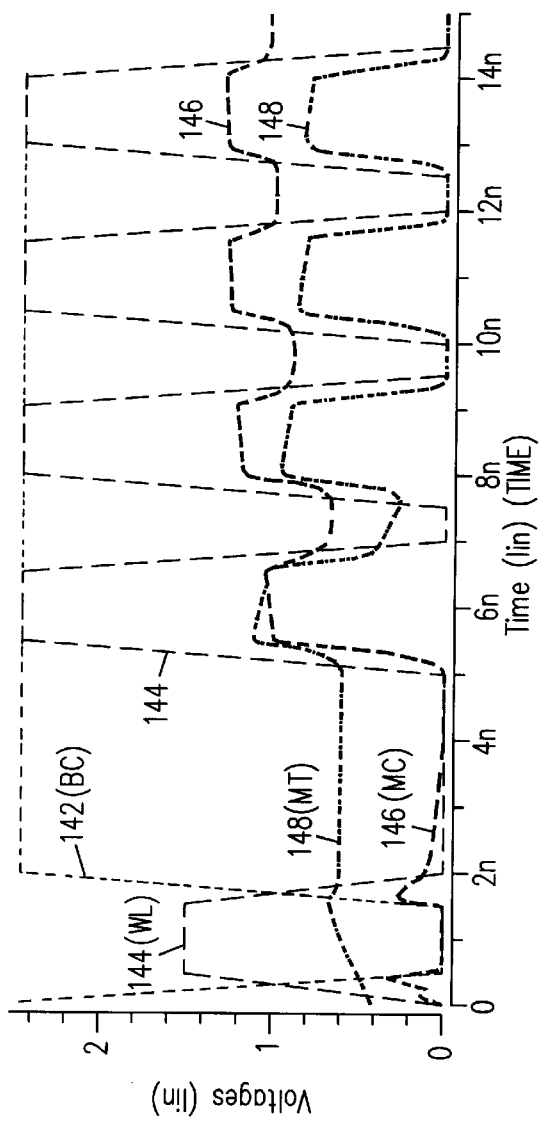
FIGS. 7A, 7B, 8A, and 8B show voltage waveforms which illustrate several test sequences performed upon the memory cell shown in FIG. 6.

Referring now to FIG. 6, a memory cell 140 is depicted which is otherwise identical to the previous description of memory cell 80 in FIG. 2 with the exception that now both P-channel load devices are open. This condition is also advantageously testable utilizing the circuits described in FIG. 1. FIG. 7A illustrates the operation of a test sequence in accordance with the present invention utilizing a VDDWL of 1.5 volts and which detects such a manufacturing defect as is depicted in memory cell 140 shown in FIG. 6.

Since both load devices LT and LC are open, memory cell 140 behaves as a "load-less" memory cell. Any high stored on either node is only dynamically stored, for neither pull-up transistor provides a conductive path to VDDMX. Internal node MC (waveform 146) is driven low when both bit line BC (waveform 142) is driven low and word line WL (waveform 144) is driven high, in this case to 1.5 volts. Such a degraded level on the word line WL causes a degraded high voltage level of approximately 0.7 volts to be written onto internal node MT (waveform 148). Unlike in the single PMOS open drain case depicted in FIG. 3A, memory cell 140 does not flip states when the word line WL is brought low at approximately two nanoseconds because, even though the voltage of both internal nodes MT and MC is low enough to turn on the corresponding load devices LC and LT, neither load device is functionally conductive, and the memory cell does not flip states. In particular, because load device LC does not provide a conductive path to VDDMX, internal node MC remains at or near VSS and the internal node MT remains (minus a small amount of downward coupling when the word line is brought low) at approximately the degraded high voltage level originally written by the previously active word line WL.

However, in the four subsequent read disturb cycles also depicted in FIG. 7A, such a memory cell 140 is caused to change states when the word line WL is driven high. The first subsequent read disturb cycle (occurring approximately at six nanoseconds in FIG. 7A) shows the voltage of both internal nodes MC and MT brought to substantially the same voltage near 1 volt. This brings the memory cell 140 to the verge of internal stability where any misbalances in the memory cell or in the memory cell's interaction with the sense amplifier will tend to cause the cell to restabilize when the word line goes inactive at either of the two logic states. An example of this can be seen in the first read disturb cycle in FIG. 7A at around seven nanoseconds where as the word line WL is brought low, the internal node MC remains higher than internal node MT, thus indicating a flipped memory cell. While the first read disturb cycle has a finite probability of detecting such a fault, the fault may not be detected on the first read disturb cycle, but may require several cycles.

Executing three sequential read disturb cycles has a high probability of detecting this kind of a fault in a memory cell.

Figure 7B:
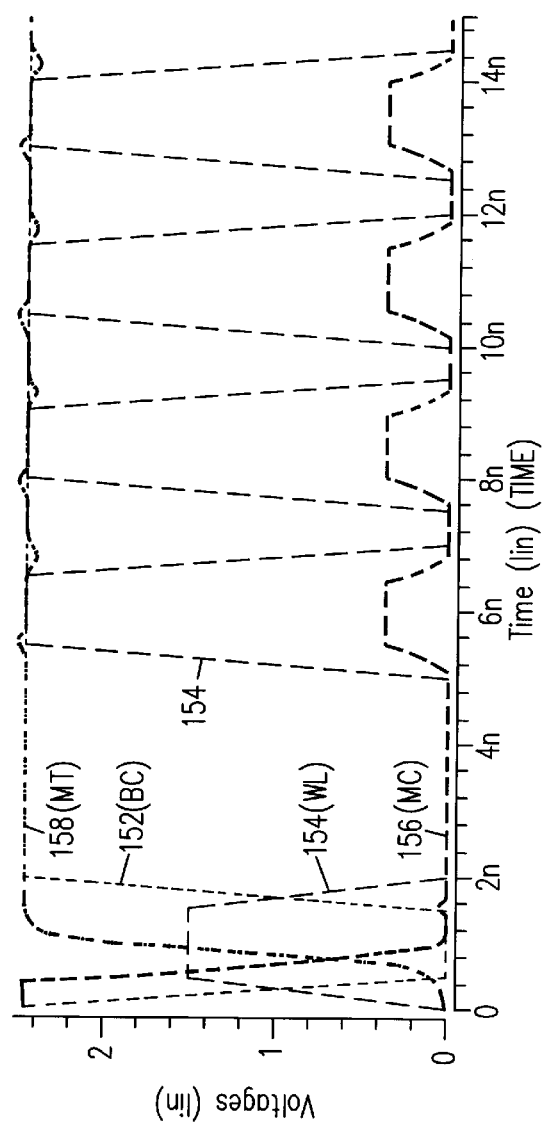

For comparison purposes, FIG. 7B illustrates the identical test sequence performed on a normal memory cell and which is analogous to the waveforms depicted in FIG. 3B. In particular waveforms 152, 154, 156 and 158 correspond to earlier presented waveforms 92, 94, 96 and 98. FIG. 7B, once again, illustrates that a normal memory cell will write and subsequently read correctly even when the active word line level is a degraded word line level of 1.5 volts. While not as robust as the single PMOS open drain test described above, this test sequence, nonetheless, has a high probability of detecting a double PMOS open drain memory cell failure, albeit, with a slightly longer test time.

Figure 8A:
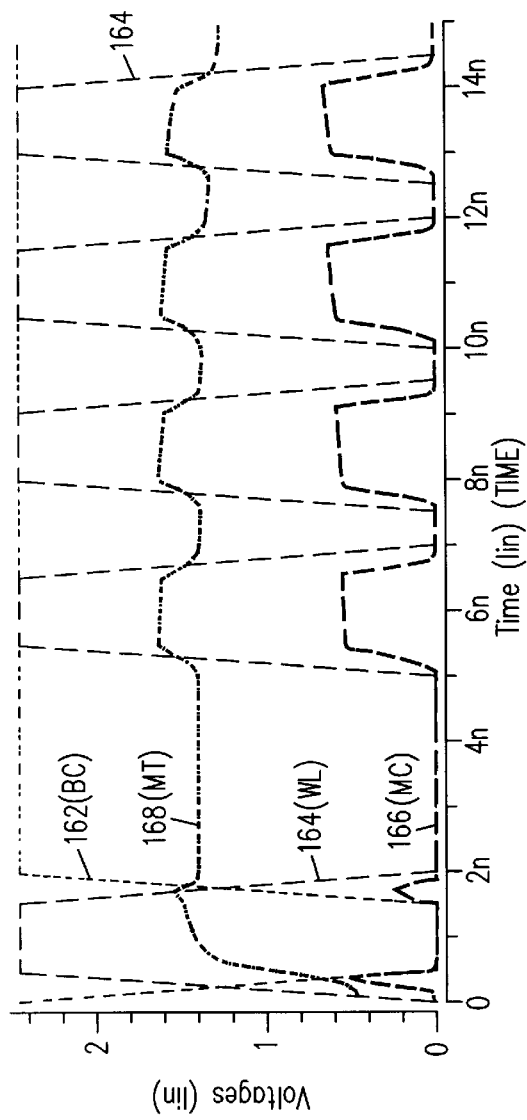

FIG. 8A illustrates the difficulty of testing this type of memory cell failure when operating the memory array 10 in a normal fashion (i.e., with a word line active level equal to the normal VDD). In this figure the internal node MC (waveform 166) is driven low when both the word line WL (waveform 164) is driven high and the bit line BC (waveform 162) is driven low. At substantially the same time, internal node MT is written to a high level of approximately 1.3 volts which is set by the active level on the word line WL (in this case, 2.5 volts) minus the threshold voltage of access transistor AT, including the body effect at this bias condition. When the word line WL is brought low at approximately two nanoseconds, the memory cell state does not flip, nor does it flip during any of the four subsequently performed read disturb cycles. However, the high level on the internal node MT is being degraded by each subsequent read disturb cycle while the low level on the internal node MC is extending higher and higher with each succeeding read cycle. Additional cycles, if shown, would indicate that ultimately such a memory cell indeed does flip states similar to that shown in FIG. 5A, although it may take a significant number of cycles to observe such a failure.

Figure 8B:
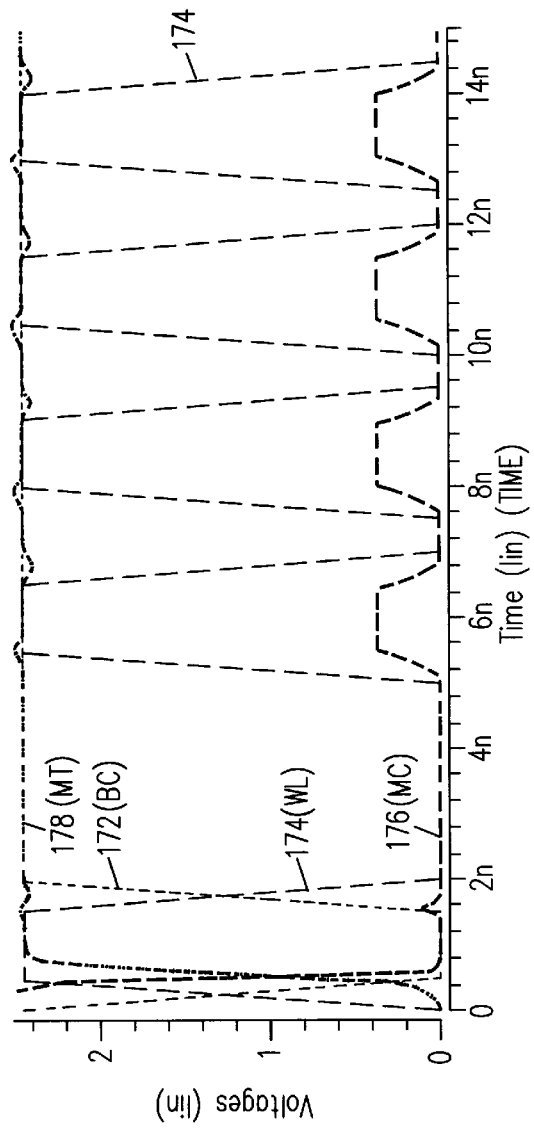

For comparison purposes, FIG. 8B illustrates the operation of a normal memory cell under the same voltages and test conditions and which is analogous to that shown earlier in FIG. 5B, namely waveforms 172, 174, 176 and 178 correspond to waveforms 132, 134, 136 and 138.

Data Retention Test—Single PMOS Floating Gate

Figure 9:
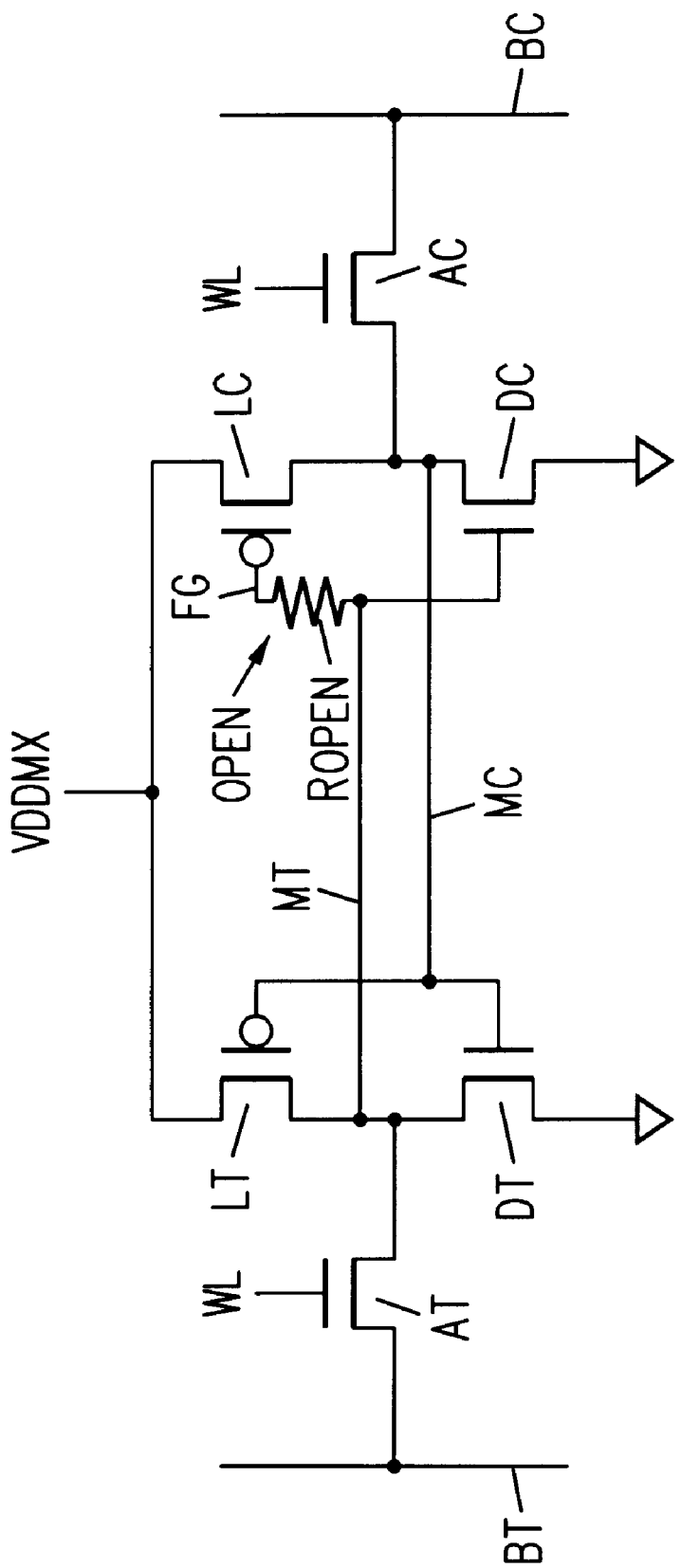
FIG. 9 is a schematic diagram of a memory cell within the memory array shown in FIG. 1, and which illustrates a third failure mode (single floating gate PMOS load device) which is testable in accordance with the present invention.

Referring now to FIG. 9, memory cell 180 is analogous to earlier described memory cell 140 but has both P-channel load devices LT and LC connected to the internal nodes MT and MC as to the drain connections, but has a simulated open circuit in the gate connection of the load device LC. In particular, the floating gate of load device LC is illustrated as a resistor ROPEN connecting internal node MT to floating gate node FG (which is the gate terminal of load device LC). This failure mechanism may, in certain circumstances, also be detectable utilizing the data retention test described above. However, at the beginning of the test sequence the VDDMX is initialized at ground (e.g., VSS potential) to allow internal leakages within the memory cell to initialize all nodes at ground potential. Then, the VDDMX voltage is ramped slowly from ground to the desired level for the test. Typically this ramp may require 100 microseconds and in the examples shown, ramps to a final voltage of 2.5 volts on the VDDMX terminal. The data retention test is then executed for true data polarity and any resulting failures indicated. Then, the test including the initial VDDMX ramp is repeated and the data retention test is executed for complement data polarity. Referring again to FIG. 9, if the value of resistor ROPEN is greater than a threshold resistance value, then the RC time constant of resistor ROPEN times the capacitance of the gate terminal FG of load device LC is long compared to the time constants elsewhere within the memory array, and the memory cell 180 will initialize with internal node MT in the high state and internal node MC in the low state. This occurs because floating gate node FG capacitively is coupled by the voltage ramp of node VDDMX and therefore rises faster than the corresponding gate terminal of the opposite load device LT (which is connected to internal node MC). Consequently, current through load device LT exceeds current through load device LC, and this dictates the direction that the flip-flop will initialize. Even if the voltage of floating gate node FG eventually is brought (through resistor ROPEN) to the same level as internal node MT (which initialized high) the power-up data state is stable. However, such a memory cell 180 will fail a data retention test which writes internal node MC to a high level. This occurs because load device LC is unable to turn on (or at least turn on quickly enough) to restore the internal node MC to a full VDDMX level, as was seen for the case depicted in FIG. 3A. Consequently, the first read subsequent to the write will fail and a floating gate on one of the P-channel load devices is detectable.

If the value of resistor ROPEN, however, is less than the earlier mentioned threshold value, the memory cell will initialize in the opposite state, that being internal node MT at a low state and internal node MC in a high state. Such a failure mechanism is difficult even with the data retention test described here to detect. The write of such a memory cell is marginal since the P-channel load device is turned on while attempting to write. It is difficult to find a set of operating conditions which will adequately test for this type of failure mechanism, yet still properly pass fully functioning memory cells.

Figure 10A:
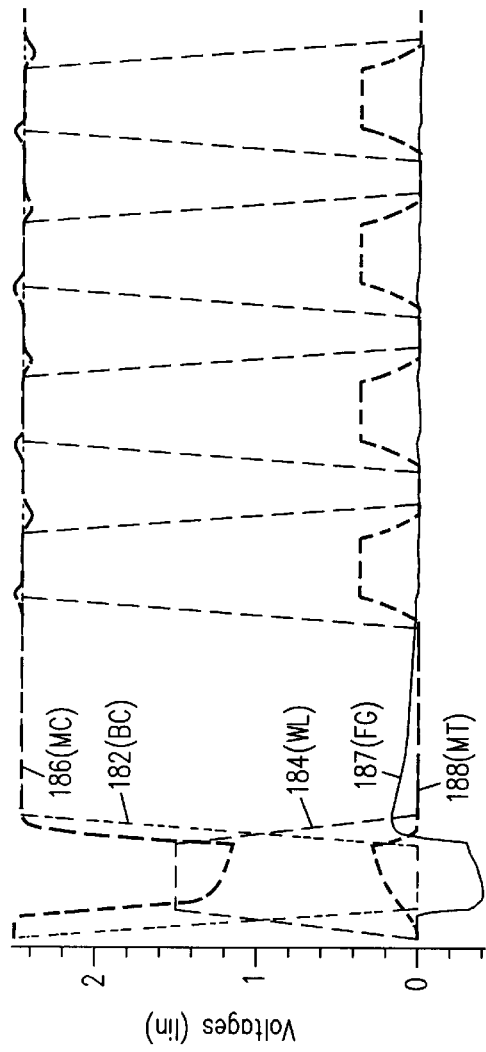
FIGS. 10A, 10B, 11A, 11B, 12A, 12B, 13A and 13B show voltage waveforms which illustrate several test sequences performed upon the memory cell shown in FIG. 9.

Referring now to FIG. 10A, an abnormal memory cell 180, having the floating gate node FG initially floating at VSS, is shown in which the initial stored data is a logic zero (i.e., internal node MT at a low level and internal node MC at a high level). A write cycle to complement data is performed using a VDDWL of 1.5 volts. When the word line WL (waveform 184) is driven high and the bit line BC (waveform 182) is driven low, the memory cell 180 attempts to write complement data, but is prevented from doing so because load device LC is unable to turn off. Internal node MC is pulled downward to approximately 1.2 volts through access transistor AC into the bit line BC, but is unable to reach a lower voltage. With such a high voltage on the gate of driver transistor DT, the internal node MT is unable to be pulled high beyond approximately 0.3 volts. As soon as the word line WL is brought low, internal node MC is brought immediately back to VDDMX and internal node MT is brought back to ground, and the write fails. The voltage of the floating gate node FG (waveform 187) is shown initially coupled negative by the downward transition on internal node MC and then upward by the subsequent upward transition of internal node MC. The RC tail on waveform 187 results from the small amount of current flowing through resistor ROPEN. This particular failure is easily detected on the first read disturb cycle after the failed write.

Figure 10B:
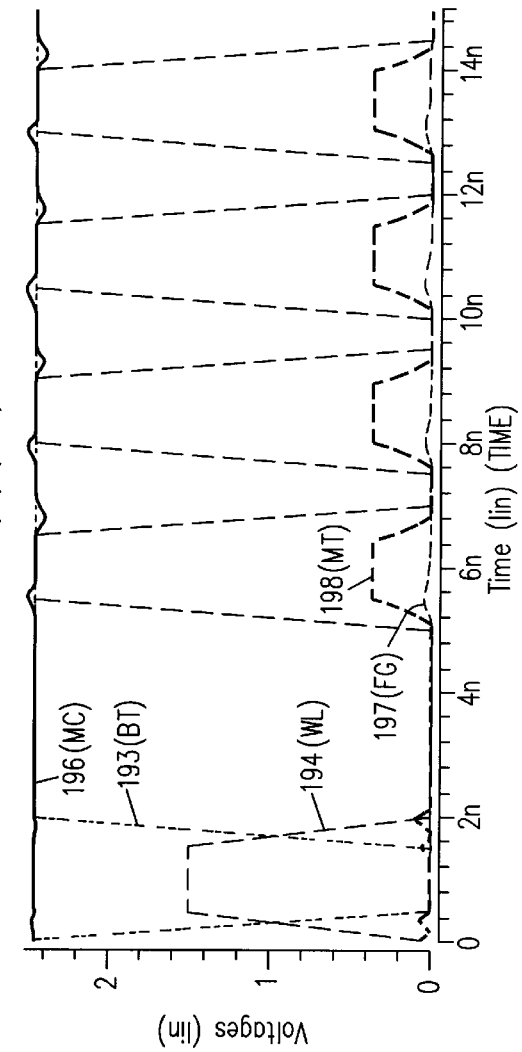

FIG. 10B illustrates waveforms for the same memory cell 180 under the same initial conditions except where an initial write cycle attempts to write a logic zero into the cell (i.e., a low voltage on internal node MT). Since this particular data state matches the initial conditions of the memory cell due to the floating gate node FG initially at VSS, the action of the word line WL (waveform 194) going high and the bit line BT going low (waveform 193) does nothing to change the high level on internal node MC (waveform 196) and the low level already present on internal node MT (waveform 198). Since there is very little change in voltage of the internal node MC, there is very little coupling onto the floating gate node FG, as indicated by waveform 197.

Figure 11A:
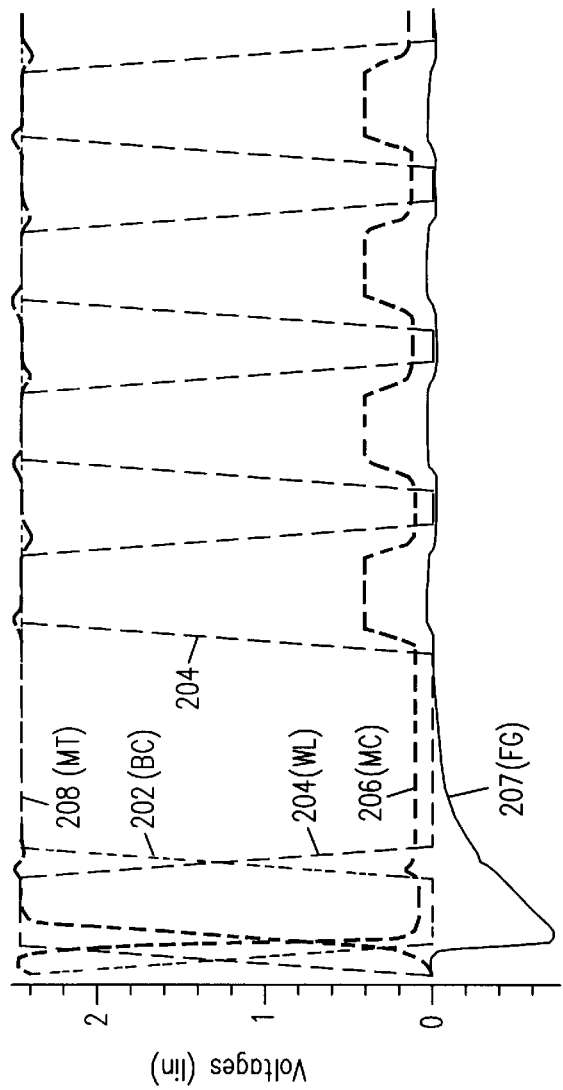

The value of a test sequence which detects a failing memory cell as shown in FIG. 10A is emphasized by contrasting the same memory cell 180 under the same conditions except using a fill VDD level on the word line as would normally be the case. Referring now to FIG. 11A, the memory cell is initialized as before in FIG. 10A with a low level on internal node MT (waveform 208) and a high level on internal node MC (waveform 206). When the word line WL (waveform 204) is brought high and the complement bit line BC (waveform 202) is brought low, the memory cell 180 is successfully written with complement data even though load device LC remains on. This is true because the strength of the driver transistor DC is able to sink the current flowing through load device LC without causing the voltage on internal node MC to rise significantly. As can be seen in FIG. 11A, the voltage of internal node MC is approximately 100 millivolts while the word line WL is active, and rises to approximately 200 millivolts when the word line WL is brought low. The voltage of floating gate node FG (waveform 207) is shown being coupled negatively by the downward transition of the voltage on internal node MC. The resistor ROPEN gradually restores the floating gate node FG voltage to a near ground level within several nanoseconds. Subsequent read cycles do not cause any disturb effects in memory cell 180 which would flip the state of its stored data. Consequently, under normal operating conditions particularly with the VDDWL driven to a full VDD of 2.5 volts (i.e., the same VDD level as is powering the memory cell 180, that being the VDDMX voltage), this particular failure mechanism is normally undetectable.

Figure 11B:
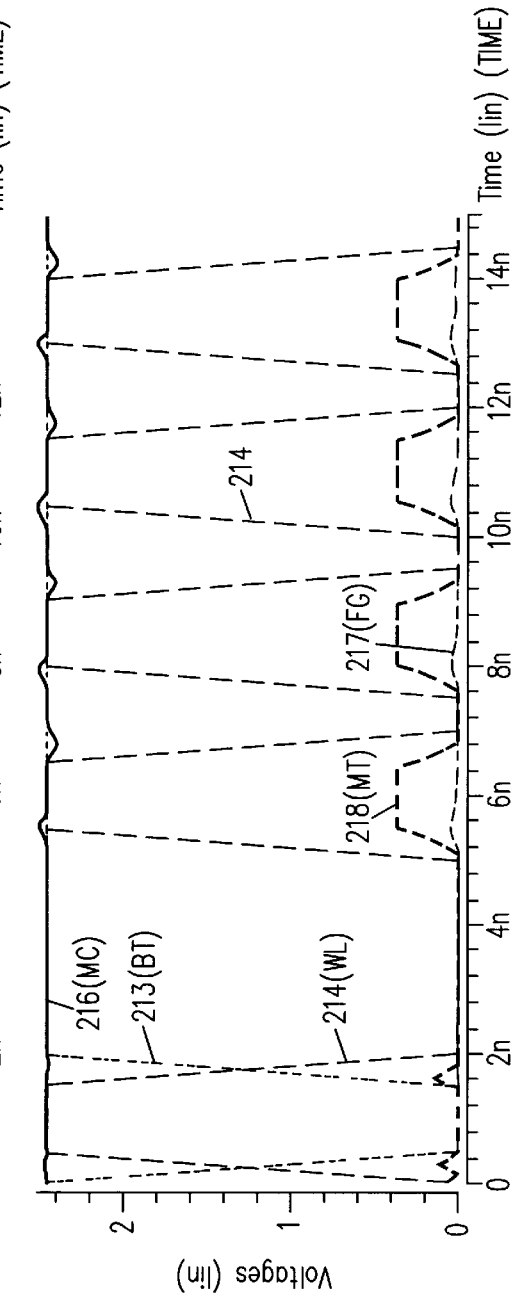

FIG. 11B describes the operation of the same memory cell 180 with the same initial conditions but writing a logic zero into the memory cell 180 and using a VDDWL equal to full VDD. The operation depicted here is analogous to that shown in FIG. 10B even though the active word line voltage in these two figures differs. Waveforms 213, 214, 216, 217 and 218 are analogous to earlier waveforms 193, 194, 196, 197 and 198.

Figure 12A:
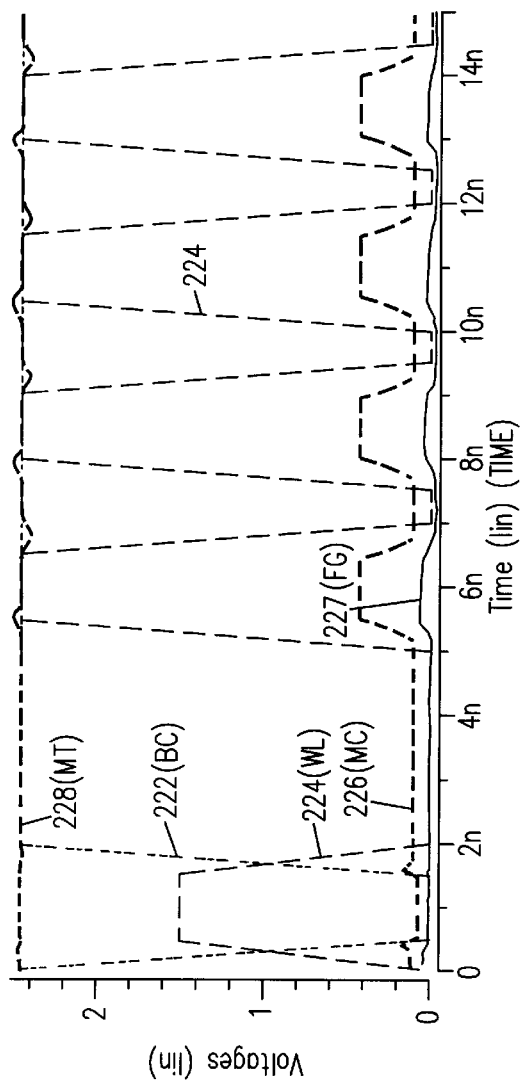

FIG. 12A illustrates waveforms analogous to FIG. 10A, but instead shows the initial state of memory cell 180 being a logic 1 (i.e., internal node MT at a high level and internal node MC at a low level). As before, load device LC has a floating gate node FG which is initially at ground potential (i.e., VSS). The low level on internal node MC is approximately 100 millivolts due to the conduction through load device LC which, in a normal memory cell would be off, but which is turned on in the memory cell 180 with the floating PMOS gate failure mode depicted therein. The write cycle proceeds when the word line WL (waveform 224) is brought to the VDDWL level of 1.5 volts while, for this particular example, the complement bit line BC (waveform 222) is brought low. Since this is the same data state as is already stored within memory cell 180, there is no change to the state of internal node MT (waveform 228) nor to internal node MC (waveform 226). Four subsequent read disturb cycles using a full VDD level on the word line WL cause no upset of the state of memory cell 180. The voltage of floating gate node FG (waveform 227) nominally remains at or near VSS and couples slightly in response to minor transitions of the voltage on internal node MC. This particular test sequence and data pattern is unable to detect the failure mode within memory cell 180.

Figure 12B:
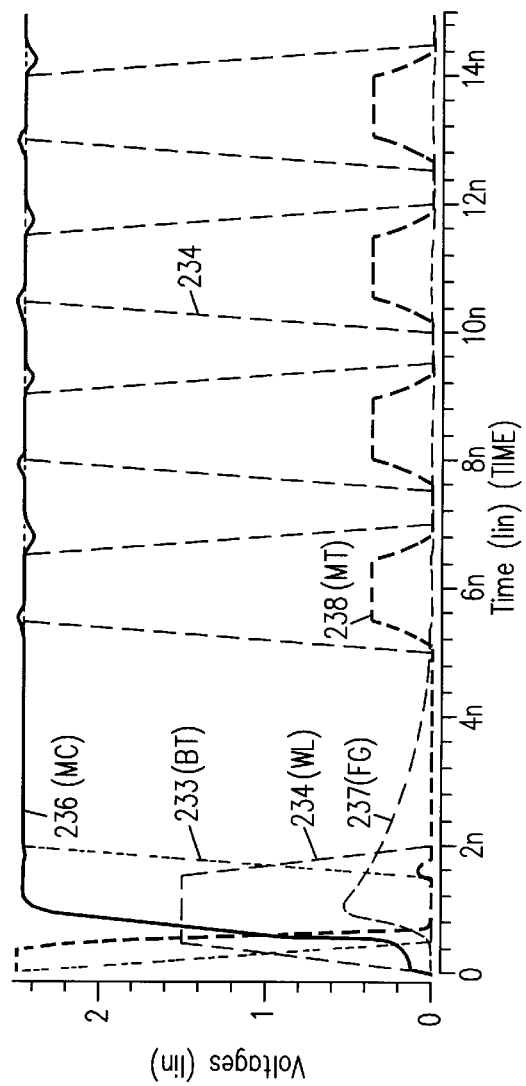

FIG. 12B illustrates operational waveforms of a test sequence of the same memory cell 180 with the same initial conditions as depicted in FIG. 12A, but instead writing a logic zero into the memory cell. The write cycle proceeds when the word line WL (waveform 234) is brought to the VDDWL level of 1.5 volts, while, for this example, the true bit line BT (waveform 233) is brought low. The initial high level on internal node MT (waveform 238) is brought low while at substantially the same time the internal node MC (waveform 236) is brought high. The write is successful, and four subsequent read disturb cycles do not change or degrade the voltage levels stored within the cell. Floating gate node FG (waveform 237) is shown initially at ground and coupled to a peak voltage of approximately 0.5 volts by the positive transition on internal node MC and then decaying back to ground by conduction through the resistor ROPEN slowly discharging the capacitance of floating gate node FG.

Figure 13A:
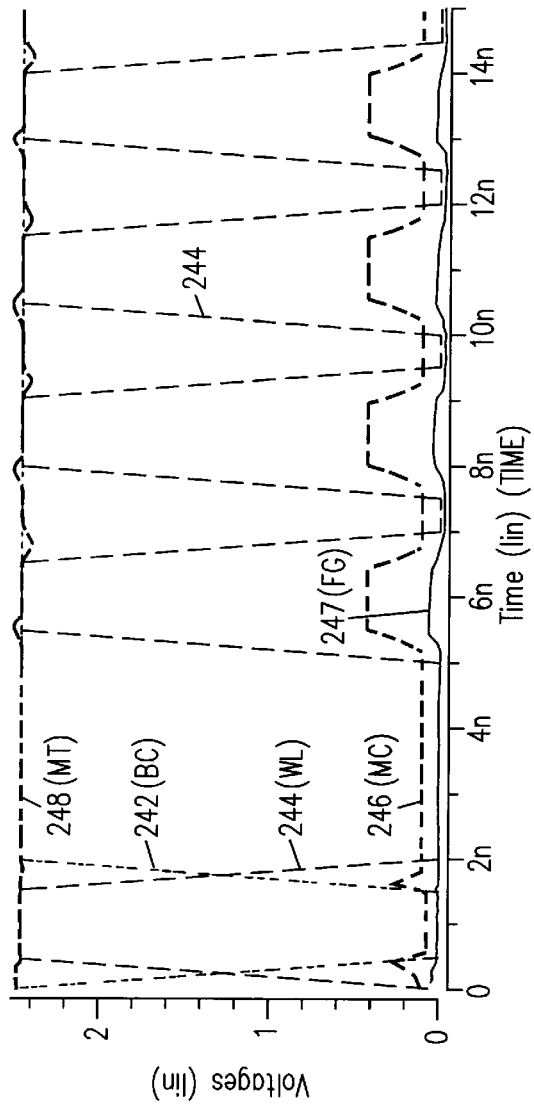

FIG. 13A illustrates operational waveforms for a test sequence of cycles identical to those depicted in FIG. 12A with the exception that the VDDWL during the write cycle is brought to a full VDD (i.e., the same VDD level as is connected to VDDMX powering the memory cells within the memory array). No substantial difference in operation is exhibited in FIG. 13A with the exception that the low level on internal node MC (waveform 246) is slightly lower when the word line WL is brought high during the write cycle (e.g., at around one nanosecond) than occurred (as shown in FIG. 12A) with a word line level of only 1.5 volts. Otherwise the waveforms are virtually identical between FIG. 12A and FIG. 13A. In particular, waveforms 242, 244, 246, 247 and 248 correspond respectively to waveforms 222, 224, 226, 227 and 228.

Figure 13B:
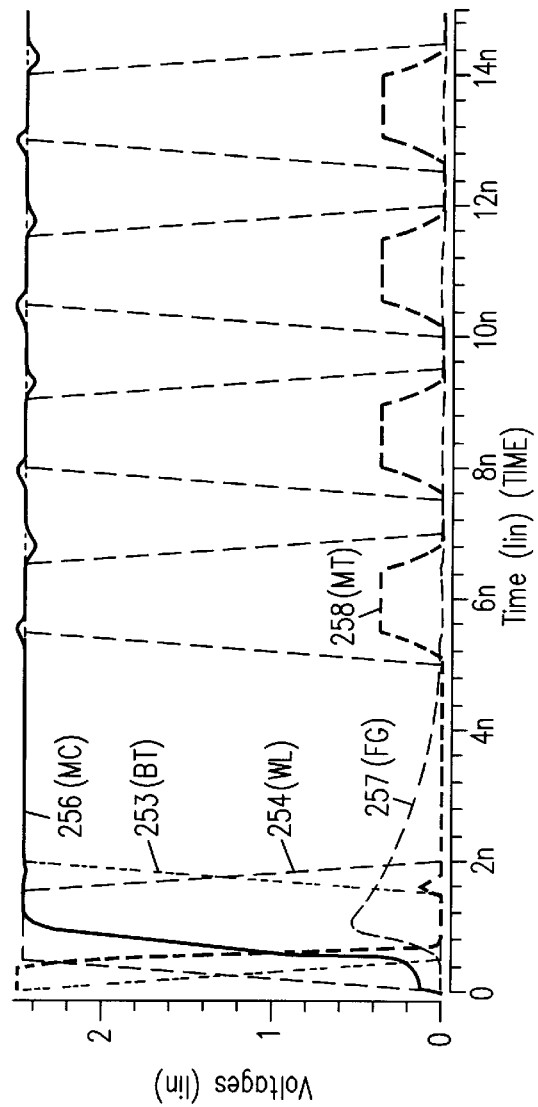

FIG. 13B illustrates for completeness the same memory cell 180 with a load device LC having a floating gate node FG on the gate terminal thereof, initially storing a logic 1 within the memory cell (i.e., internal node MC at a low level and internal node MT at a high level). The operation depicted in FIG. 13B is very similar to that shown in FIG. 12B with the exception that the VDDWL voltage during the write cycle in FIG. 13B is at a full VDD. Waveforms 253, 254, 256, 257 and 258 are respectively analogous to waveforms 233, 234, 236, 237 and 238 shown above in FIG. 12B.

Standby IDD Test

Referring again to FIG. 1, the memory array 10 includes an isolated C4 solder bump terminal VDDMX which is used to power just the memory cells within the memory array. This isolated C4 terminal VDDMX is accessible during wafer level testing and is preferably connected to the normal operating VDD power plane when assembled into a semiconductor package. Consequently during wafer testing the separate VDDMX terminal allows straightforward testing of the standby IDD current flowing into the memory cells within the memory array. Such an independent and isolatable test is highly advantageous for unambiguous testing of memory cell standby current, particularly when such a memory array 10 may be imbedded within a much larger integrated circuit device such as a microprocessor. It is particularly useful to help isolate small leakages which might occur in each of the memory cells, but which, when added together across all the memory cells in a large memory array, constitute a significant amount of standby current and otherwise might be difficult to isolate from other constituent components of standby current which flow through other subcircuits within the same integrated circuit.

The ability to test the memory cell standby current $I_{DDQ}$ independently is also useful to help detect the presence of a floating PMOS gate within the memory array 10. Such a floating gate (as was described above) frequently results in excessive current flow through a particular memory cell due to the simultaneous conduction of a load device and the corresponding driver device. The magnitude of such conduction can easily be high enough to significantly influence the standby currents otherwise flowing through even a fairly large memory array. When combined with the additional tests described above for detecting floating P-channel gates, the $I_{DDQ}$ test, which is both an easy test and a very short test, can enhance the likelihood of detecting such memory cell failure modes which cause abnormally high memory cell current. Other examples include defects causing a drain-to-source short in a transistor within a memory cell.

Alternatively, it is also possible to package an integrated circuit containing such a memory array 10 in a manner such that the VDDMX terminal is brought out and made available, even when packaged. Such a capability would allow similar testing even when packaged. A potential disadvantage of doing so is the likelihood of differential noise between the VDDMX supply and other VDDs supplying power to remaining circuits within the integrated circuit. Such differential noise is reduced by connecting the various isolated VDD terminals (e.g., VDDMX, VDDWL) together as close as possible to the actual integrated circuit itself. By using C4 solder bump technology in combination with a well-designed package cavity having a significant power plane, a low impedance, low inductance interconnection is provided between the variety of terminals to which the various C4 solder bumps attach, and such unwanted voltage differential can be made nominally small. The isolated terminal VDDMX may alternatively be implemented as a bonding pad suitable for wire bonding, rather than as a C4 solder bump for flip chip assembly, although the inductance of the wire bond may not provide as low a differential VDD noise as a C4 solder bump implementation. It should also be appreciated that while the isolated C4 solder bump terminal VDDMX is indicated in FIG. 1 as a single solder bump terminal, a large number of such terminals may be implemented, all connected together and spatially distributed near the various memory cells of the array. Moreover, independent C4 terminals may be used, such that various portions of the memory array may be independently powered to further enhance testability and to more readily localize defects which the memory cell standby current measurements help to detect.

Another advantage of using C4 solder bump technology to implement the isolated terminal VDDMX is the disabling of the test capability once packaged. When the isolated terminal VDDMX is connected to the remaining VDDs within the package cavity itself, all the VDDs may be more easily bypassed within the package and on a printed wiring board (PWB), thus helping to reduce noise on the VDD lines.

Alpha Particle Test

The isolated C4 terminal VDDMX also allows for straightforward testing to determine the alpha particle susceptibility of memory array 10. Such a test may be performed by initially testing the memory array 10 using any of a variety of suitable memory test algorithms which are well-known in the art. This test is performed at a particular VDDM voltage, which is then varied and the memory array 10 tested again. This is repeated to develop a curve which shows the sensitivity of alpha particle-induced errors as a function of the voltage applied to the VDDMX terminal. Such a curve usually exhibits a rather sudden break point at a particular value of VDDMX in which the susceptibility to alpha particle-induced errors increases rapidly, even with slight reductions in applied VDDMX level. The margin of the device is then easily computed by the difference in voltage at which the memory array is normally operated and the voltage where such a break point occurs. Higher values of VDDMX result in increased resistance to alpha particle-induced errors for at least two reasons. First, at higher VDDM voltage levels, the internal high level written into a memory cell is likewise at a higher level. The decay in voltage of an internally stored high level within a memory cell, which is caused by an alpha particle trajectory through the semiconductor in proximity to such a memory cell, has more margin before the internal high is brought to a low enough voltage to cause an upset in the memory cell. Stated simply, the capacitance of an internal node must be discharged by a greater amount with higher VDDM levels before causing a memory cell upset. Secondly, a higher VDDM voltage level also causes additional current in the load devices within the memory cell. This occurs because the internal low level of the memory cell provides the gate voltage for a load device which is conductive. Since the source of the load device is tied to VDDMX, higher levels of VDDMX result in increased turn-on voltage to the P-channel load device which causes additional current flow into the internal node presently at a high logic level, thus helping to counteract the effects of charge collection by the internal node when an alpha particle strikes near the memory cell.

It may be thought that in a traditional integrated circuit device (which includes a memory array which is connected in traditional fashion to a common VDD terminal) a similar alpha particle sensitivity curve may be developed by merely changing the VDD applied to the entire device and performing appropriate memory test routines at a variety of different VDD levels. A problem with this approach occurs because at sufficiently degraded VDD levels applied to an entire device, other subcircuits may start contributing to the observed failures. This masks the ability to independently discern the susceptibility to alpha particle induced errors. For example, the sense amplifier margin of a memory array may worsen at lowered VDD. Worse, the entire part may cease to be functional at a VDD level which has not yet uncovered the expected break point in the memory test curve. Consequently the ability to independently power the memory cells within the memory array 10, while operating all remaining circuits on the remainder of the integrated circuit containing the memory array 10 at traditional values of VDD for which such circuits were designed and tested, allows unambiguous isolation of alpha particle induced errors within the memory array 10.

The isolated C4 terminal VDDMX may be left accessible even after assembly into a semiconductor package. This allows an end user of the integrated circuit containing the memory array 10 to provide a higher VDD level to the memory cells via the VDDMX terminal than is provided to the remainder of the circuitry within the integrated circuit. Such a situation may be increasingly desirable as power supply voltages are continually reduced and which would allow a memory array to operate independently at a VDDMX level set by required tolerance for alpha particle hits. Such a capability may have significant benefits even if the VDDMX level applied to the memory cells is only a few hundred millivolts higher than the remainder of the integrated circuit, since alpha particle susceptibility can be significantly enhanced by such seemingly small changes in applied voltage.

Sense Amplifier Offset Voltage Test

Referring again to FIG. 1, direct access to a pair of bit lines is provided by a multiplexer which is statically decoded to couple a pair of isolated terminals BTP and BCP to the respective bit lines within the decoded column. This allows, for example, DC voltage levels to be impressed or sensed on each of the two bit lines within the decoded column and/or the two bit line currents to be sensed. The test address signals received by test address predecoder 18 are predecoded and provided to test bit line mux decode 20 which decodes and selects one column within the memory array 10 which is coupled to the pair of isolated terminals BTP and BCP. The offset voltage of the sense amp for a particular column may be tested by forcing a particular differential voltage on the two bit lines within the selected column, and then latching the sense amplifier to determine whether the bit line differential was sensed properly or improperly. If such a test is repeated for a variety of input differential voltages provided onto the bit line pair, then a determination of the actual sense amp offset voltage for that particular column may be determined.

To accomplish this, a test column address (not shown) is provided to test address predecoder 18 to select the particular column to be tested. The test column addresses may be provided in a variety of fashions, including direct access and also via a scan chain, which is particularly effective if the memory array 10 is contained within a larger integrated circuit such as a microprocessor. The test bit line mux decode 20 uses the predecode signals 67 to decode and drive the appropriate control signals to enable a particular multiplexer circuit, such as multiplexer circuit 22, to couple the true and complement bit lines of the selected column to the true and complement test pads BTP and BCP, respectively. Write circuits resident on the selected column are held in a high impedance state, much as if they would be if during a read cycle. A word line which would otherwise be selected and driven high in response to a row address presented to row decoder 16 is turned off so that no memory cell is coupled to the bit lines, and so that the voltage applied to test pads BTP and BCP is conveyed onto the true and complement bit lines BLT<0> and BLC<0> without resistive drops due to unwanted current flow. The row decoder within the memory array 10 shown in FIG. 1 can easily be disabled such that no row is selected by tying isolated C4 terminal VDDWL to ground. This is a particularly effective way to disable an otherwise selected row which does not require circuit changes within the row decoder itself which might increase propagation delay through the row decoder. The sense amplifiers are then latched in the normal fashion. While there will be no differential signal nominally applied to any of the columns which are deselected by the test bit line mux decode 20, the selected test column is latched by its respective sense amplifier while the externally forced differential voltage is conveyed by the voltage on test pads BTP and BCP. The sense amplifier outputs are then interrogated in accordance with the architecture within which the memory array finds itself. In a stand-alone memory device having a relatively simple data I/O path, the output of a given sense amplifier is easily decoded by normal read column decode circuitry and is interrogatable typically at a data out pin of the device. Alternatively, in an embedded memory array implementation, scan logic may be employed to directly access the output circuits within memory array 10. Exemplary scanning sense amplifier circuits useful for reading out an embedded memory array may be found in co-pending, commonly-assigned, concurrently-filed U.S. patent application Ser. No.: [unassigned, Attorney Docket No. M-5153 US], entitled "Scannable Sense Amplifier Circuit" and naming Dennis L. Wendell as inventor, which application is incorporated herein by reference in its entirety.

This test is then repeated for each column to be tested. The test may be repeated with a large number of differential voltages presented between the test pads BTP and BCP to carefully characterize the sense amplifier offset voltage, or the test may be readily implemented using a specific differential voltage and a single test to determine whether the offset voltage is less than the provided differential voltage. Such a Go/No-go test would typically be beneficial to conduct with two tests: one testing the positive value of such a differential voltage, and the other testing the negative value of that same differential voltage.

This capability can be used to separate variables when debugging a failing device incorporating a memory array such as memory array 10. Each sense amplifier may be tested to insure functionality of the sense path from the bit lines to the data out. Then, by elimination, a failing part in which each column correctly passes the sense amp path test must therefore be failing in the word line predecode path rather than in the sense amp path. Attention can then be directed toward further tests to isolate the cause of such a failing device.

The ability to test the offset voltage of each sense amplifier is particularly useful to detect any edge effects near the boundary of the memory array. For example, a sense amplifier located in the very last column at the edge of a memory array may behave differently than most other sense amplifiers physically located well within the interior of the memory array. This can occur from a wide variety of reasons, including etching variations of various geometries as a function of the density of the various geometries. In particular, the final gate length resulting from the polysilicon etch of a traditional MOS transistor may be different for the polysilicon features nearest the edge of the memory array because of a change in the density of polysilicon features which may occur at the edge of the array. Additionally, such an edge sensitivity may arise due to capacitive coupling from nearby nodes outside the extent of the memory array, and may result from collection of charge carriers which are injected from circuits external to the memory array, or from other reasons. The ability to isolate sense amplifiers having poorer offset voltage which are due to edge effects, but which do not occur for the substantial bulk of the sense amplifiers internal to the memory array, can also help focus efforts to improve the sense amplifiers which exhibit characteristics worse than typical. Characterization such as measuring the offset voltage of a sense amplifier in a memory array embedded within a larger integrated circuit such as a microprocessor has traditionally been extremely difficult to accomplish without laborious micro-probing on an unpassivated wafer. With the advent of increasing numbers of metal interconnect layers, and moreover, with ever narrower line widths of metal interconnect layers, it is increasingly difficult to even electrically access enough memory array nodes to be able to characterize sense amp offset voltages. The circuits and methods disclosed herein provide a significant capability which is very silicon-area efficient, very harmless when not enabled, and yet very powerful in its ability to afford either manual or highly automated testing of such previously difficult measurements.

DC Memory Cell Characterization Tests

The circuits shown in FIG. 1 provide a significant capability to perform DC characterization of several features of each memory cell within memory array 10. The row decode 16 includes a static word line select signal TESTEN2 to disable self-resetting logic within the row decoder and to allow the word line to remain active for a user-controlled length of time. The analog word line drive capability previously described allows the active word line to be driven to a user-controllable analog voltage level which is provided on isolated C4 terminal VDDWL. The direct access to a pair of bit lines, also previously described, allows a voltage to be forced or sensed and/or a current to be forced or sensed on each respective bit line within the selected column. The isolated terminal VDDMX which powers each of the memory cells within memory array 10 also provides an important capability which enhances the testability of each memory cell. By utilizing one or more of these features together, a variety of extremely useful DC characterization tests may be performed on each of the memory cells within memory array 10.

With most of these tests, the self-resetting row decoder is disabled so that the selected row remains statically high throughout the entire test cycle. Also, the write and sense circuits connected to each respective bit line pair are disabled so that they are forced into a high impedance state, and the test bit line mux decode 20 is enabled so that a column selected by a test address is coupled to the pair of test pads BTP and BCP, as described above. Such a test mode allows for access to a memory cell where the word line voltage presented to that memory cell is controllable to an analog level and both true and complement bit lines connected to that memory cell are directly brought out to test pads, while no additional circuitry otherwise connected to the true and complement bit lines interferes with either conditions impressed upon the bit lines or voltages and currents sensed on each of the bit lines. This is a tremendously powerful capability to provide fill access to a single memory cell in an analog voltage environment without laborious microprobing, nor requiring destructive analysis techniques such as etching upper layers of metal to uncover a memory cell below. With this as a background, several DC characterization tests are described below.

Access Transistor Threshold Voltage Test

Figure 14:
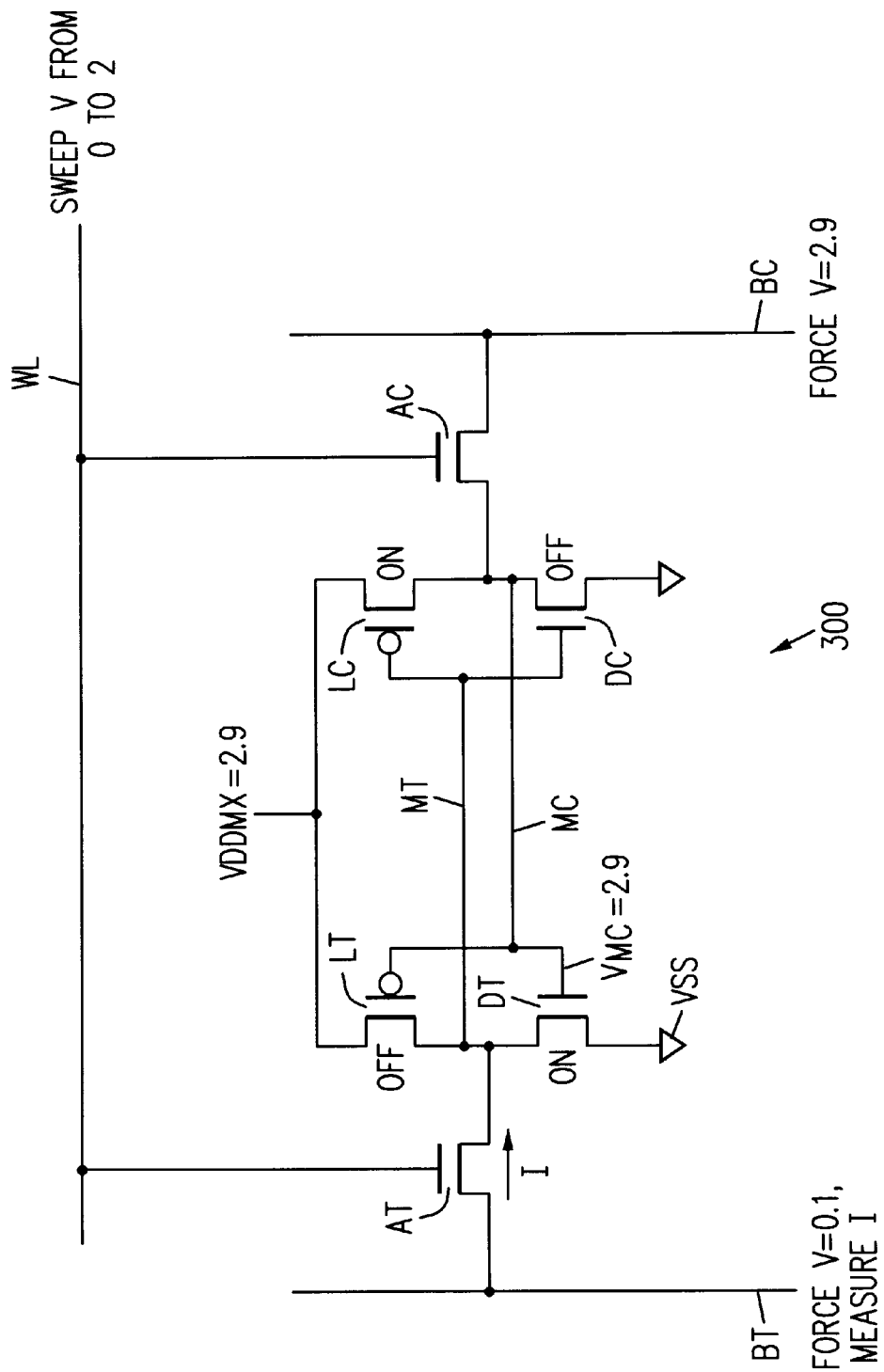
FIG. 14 is a schematic diagram of a memory cell within the memory array shown in FIG. 1, and which illustrates bias conditions within the memory cell while measuring the access transistor threshold voltage, in accordance with the present invention.

Referring now to FIG. 14, memory cell 300 is shown which uses the naming conventions described previously above. In particular, memory cell 300 includes load devices LT and LC, driver transistors DT and DC, access transistors AT and AC, true bit line BT and complementary bit line BC, and word line WL. The power supply terminal for the memory cell is VDDMX. The threshold voltage of an access transistor, for example, access transistor AT, can be measured by initially writing the memory cell to a logic zero such that internal node MT is low and internal node MC is high. Then, if not already entered, the test mode is entered which allows static control of analog voltages on the word line WL and the bit lines BT and BC. Complementary bit line BC is forced, for example, to 2.9 volts, while true bit line BT is forced, for example, to 0.1 volts. The word line WL is then swept in voltage from zero to 2 volts and the current into bit line BT is measured as a function of the word line voltage. Substantially no current will flow when the voltage of word line WL is lower than the threshold voltage of access transistor AT, and current will increasingly flow as the word line voltage applied to the gate terminal of transistor AT increases above the threshold voltage of access transistor AT. This occurs because the internal node MT is held robustly to ground by driver transistor DT whose gate voltage is equal to the high level previously written into the cell, for example, 2.9 volts. Since driver transistor DT is turned on by several volts while the word line voltage WL transitions near the threshold voltage of transistor AT, the voltage of internal node MT is held substantially at ground. This means that the drain-to-source voltage across access transistor AT may be set by the voltage applied to the true bit line BT, and the beta ratio that might otherwise be formed between transistor AT and driver transistor IDT has a negligible effect because of the disparity of the turn-on voltage between these two transistors. Load device LT is firmly held in an off state and perturbates this current measurement very little.

The threshold voltage of access transistor AT may, as a result, be determined using a variety of techniques such as a VT at one micro amp or at any reasonably low current level. It may be measured using any of a variety of drain-to-source voltages (including high values of drain-to-source voltage), which allows extensive characterization of the threshold voltage over a wide range of bias conditions. Obviously the complement access transistor AC may be characterized by reversing the test and performing similar measurements with opposite data polarity and signals.

Load Device Characterization

Figure 15:
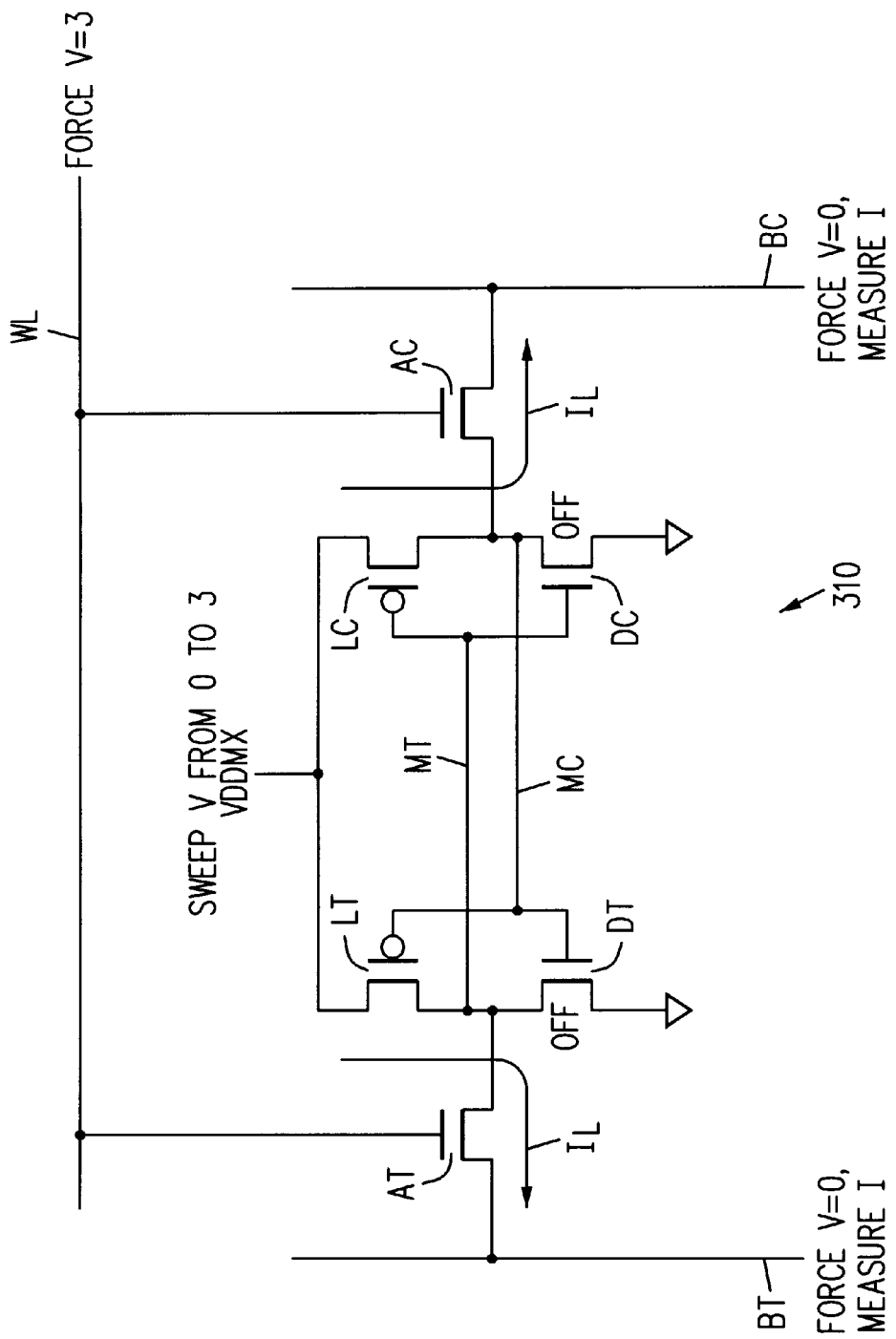
FIG. 15 is a schematic diagram of a memory cell within the memory array shown in FIG. 1, and which illustrates bias conditions within the memory cell while measuring DC characteristics of the PMOS load devices, in accordance with the present invention.

Referring now to FIG. 15, both the threshold voltage and the $I_{DS}$ of the load devices may be measured directly. Memory cell 310 is shown labeled in accordance with earlier similar memory cells. The voltage on the word line is forced to a high voltage, such as 3 volts, while the voltage of both true bit line BT and complement bit line BC are forced to zero. This forces a very low voltage level on both internal nodes MT and MC. The VDD for the memory cell VDDMX is then swept from zero to a voltage representative of the expected or worse case values of VDD, such as 3 volts, while the current flowing into each of the true and complement bit lines BT and BC is measured. Initially when the voltage of VDDMX equals zero, both load devices and LT and LC are off and no current will flow into either bit line. But as the voltage forced on VDDMX reaches the threshold voltage of load device LT, current will start flowing through load device LT, through access transistor AT and into the true bit line BT. No current will flow through driver transistor DT as this device remains firmly off. The voltage drop across access transistor AT is negligible because the turn-on voltage of access transistor AT far exceeds the turn-on voltage of load device LT. Consequently the voltage of internal node MT faithfully replicates that which is forced onto true bit line BL. Similarly, the threshold voltage of complementary load device LC may also be measured by measuring the current flowing into complement bit line BC as VDDMX is ramped. Both threshold voltages, even if different, may be measured simultaneously. Moreover, $I_{DS}$ may also be measured at a wide range of $V_{GS}$ values. For example, when the voltage on VDDMX reaches 2.5 volts (which is a standard anticipated power supply value) the $V_{GS}$ voltage across load device LT is substantially equal to the voltage level applied to VDDMX. This simulates the bias condition of the load device within a normal memory cell when conductive. The amount of current flowing through load device LT under these conditions flows through access transistor AT and into true bit line BL, which is then measured to determine $I_{DS}$ of load device LT. During this test an amount of current flows through transistor AT which is high enough to cause a non-insignificant voltage drop across transistor AT. This voltage drop may cause some inaccuracy in the $I_{DS}$ measurement because the actual drain-to-source voltage across load device LT may be unknown. (The voltage on internal node MT is clearly higher than the voltage of true bit line BL when positive current flows into the true bit line BL.) However, characterization of the access transistor AT performed earlier may allow a compensating voltage to be forced upon true bit line BL of an amount sufficient to set the bias point of internal node MT very close to a known voltage, thereby accurately impressing a drain-to-source voltage across load device LT for accurately measuring $I_{DS}$ at that given $V_{DS}$.

Driver Transistor Threshold Voltage Test

Figure 16:
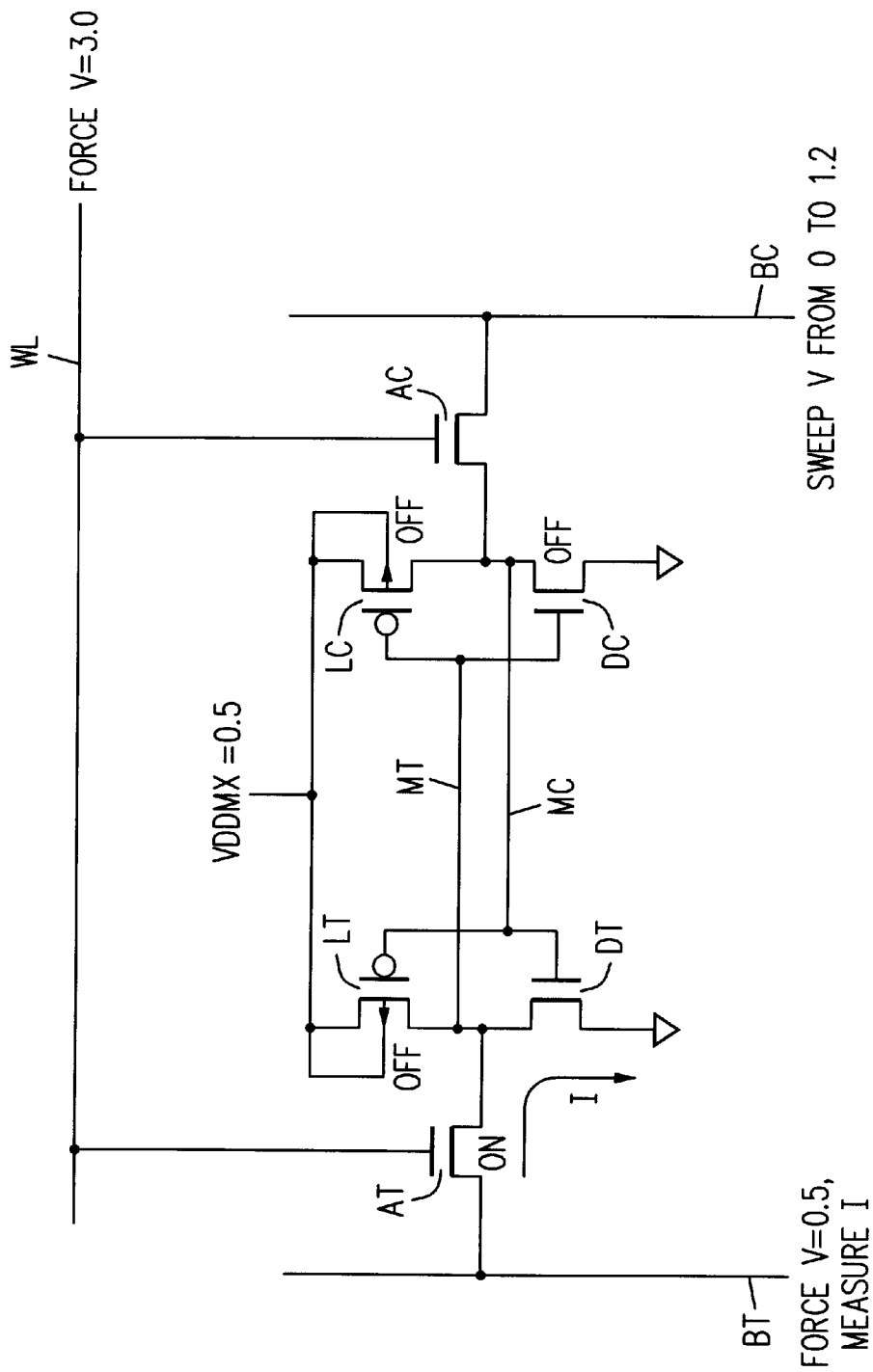
FIG. 16 is a schematic diagram of a memory cell within the memory array shown in FIG. 1, and which illustrates bias conditions within the memory cell while measuring the driver transistor threshold voltage, in accordance with the present invention.

Referring now to FIG. 16, the threshold voltage of each driver transistor DT and DC may also be measured. For example, the voltage of VDDMX is set to 0.5 volts while the word line WL is forced to a 3 volt level. The true bit line BT is forced to a 0.5 volt level and is configured to measure current flowing into the bit line BT. Complementary bit line BC is swept in voltage from zero to 1.2 volts, and the current into true bit line BT is measured as a function of the voltage forced upon complementary bit line BC to determine the threshold voltage of driver transistor DT.

To understand this, consider the initial voltage of complementary bit line BC at zero volts. Because access transistor AC is turned on hard by the high (e.g., 3 volts) voltage on word line WL, the internal node MC is driven to follow the voltage of the complementary bit line BC. This initially turns off driver transistor DT. With a forced voltage of 0.5 on true bit line BT, internal node MT is driven to the same voltage by access transistor AT. This results in both load devices LT and LC being off. Thereafter, as the voltage of the complement bit line BC rises, access transistor AC will drive the internal node MC to follow the complementary bit line BC. When the voltage on internal node MC reaches the threshold voltage of driver transistor DT, current starts flowing through the driver transistor DT, through the access transistor AT, and is detectable as current flow from test pad BTP into the bit line BT. As the voltage on internal node MC continues to rise, current flow through transistor DT will increase. By correlating the current flow through transistor DT with the voltage impressed upon complement bit line BC, the threshold voltage of transistor DT may be easily computed. Moreover, such threshold measurements may be performed using a variety of different drain-to-source voltages across driver transistor DT, particularly those somewhat near ground potential, for which the bias conditions keeps both load devices LT and LC off. Suitable voltages for VDDMX may also be chosen consistent with keeping both load devices LT and LC turned off. Even if driver transistor DT pulls internal node MT substantially to ground, the VDDMX voltage may be as high as the P-channel threshold voltage without turning on either load device LT or load device LC. The internal node MC may be driven a diode drop above the VDDM voltage before turning on the diode between the N-wells of load devices LT and LC and the P-type diffusions connected to internal node MC at the drain terminal of load device LC. This is because the substrate connection of load devices LT and LC (i.e., the N-well within which such load devices are fabricated) is also connected to the VDDMX terminal. This driver transistor threshold test is analogously performed on the complement side to measure the threshold voltage of driver transistor DC.

Other Tests

A variety of additional tests may also be readily performed to determine useful characteristics of the memory cell. For example, the read current which a memory cell, when accessed, draws from a high bit line, may be directly observed by forcing the bit lines to a quiescent read state and by measuring the current flowing into the bit line from the test pads BTP and BCP. Additionally, the voltage which is necessary on a bit line to achieve the writing of a memory cell can also be directly observed by driving the word line to an appropriate level to initialize the memory cell to a given data state, and then forcing the appropriate bit line low to write the complement data state. If the current in the non-writing bit line (i.e., the bit line which remains high during the write test) is observed, the current which the memory cell sinks from the non-writing bit line ceases when the low-going bit line reaches a sufficient voltage to cause the memory cell to change states. Consequently, the voltage necessary to write a memory cell is directly observable by sweeping the voltage on the low-going bit line and observing at which point current flow stops or reverses in the non-writing bit line.

Additionally, the integrity of a bit line may be tested for shorts to adjacent structures, such as VSS, VDD, the complement bit line, a neighboring bit line, and the word line.

Scan Test Modes

Several different test modes are desirable to implement the variety of tests described above. A first test mode enables the test bit line mux decode 20 and allows the voltage on both a selected true and complement bit line to be forced from the external test pads BTP and BCP, but otherwise preserves normal functioning of the sense amplifier circuits. This in particular provides for the sense amplifier offset voltage test described above. Other circuits which are connected to the true and complement bit lines, such as equilibration transistors, are also disabled as are static load devices connected to the true and complement bit line. An exemplary equilibration circuit which is disabled during such a test mode is described in co-pending, commonly-assigned, concurrently-filed U.S. patent application Ser. No.: [unassigned, Attorney Docket No. M-5167 US], entitled "Selective Bit Line Recovery In A Memory Array" and naming Dennis L. Wendell as inventor, which application is incorporated herein by reference in its entirety. In this first test mode, the row decode is not affected because an otherwise active word line may be essentially de-selected by connecting the VDDWL to ground.

A second test mode additionally disables all sense amp and other column circuits as well as disabling the self-resetting logic within the row decoder. This allows the selected word line to remain high throughout the entire clock cycle, and particularly enables the various DC characterization tests described above. During this second test mode, all column circuits are held in a high impedance state thus allowing unfettered access of the true and complement bit lines via the true and complement test pads BTP and BCP. This allows even extremely small currents to be measured without perturbation by other sources of current which may be otherwise coupled to the true and complement bit lines. Moreover, an analog voltage may be forced on the selected word line by the isolated C4 terminal VDDWL. The word line in this second test mode remains active for the entire duration of the clock cycle which is user controllable and may last an arbitrarily long amount of time to allow for manual measurements, if need be.

A third test mode useful to the test sequences described above provides for locally recirculating the input registers to the row and column decoders during the first clock after scan exit prior to which the respective addresses were scanned into the respective buffers.

The present invention is particularly well suited for static memory arrays embedded within larger integrated circuits, such as a microprocessor. For example, the invention may be advantageously utilized to test and characterize static memory cells which are utilized to implement cache memory arrays within such a microprocessor. An exemplary embodiment of such a cache memory array is described in U.S. Provisional Application Serial No. 60/027,329, entitled "An X86 Microprocessor with Multi-Media Extensions," already incorporated herein by reference in its entirety.

Figure 17:
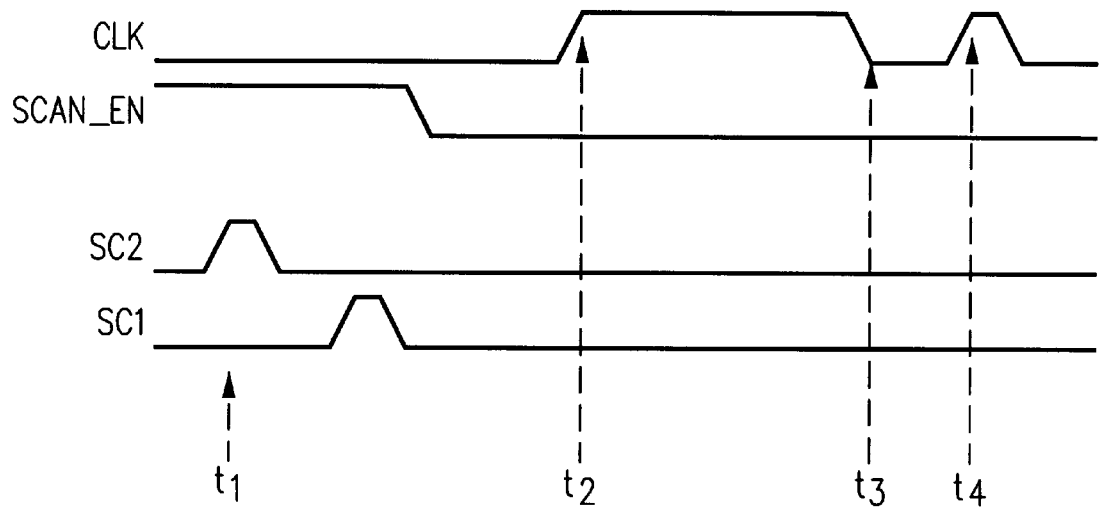
FIGS. 17 and 18 are timing diagrams which illustrate the operation of various test modes and the interaction with scan clocks to facilitate testing an embedded memory array, in accordance with the present invention.

Referring now to FIG. 17, a suitable clocking sequence is shown which may be utilized to set up memory array 10 into a high impedance bit line state for the I–V testing of the memory cells. Waveforms are indicated for a memory clock CLK, a scan enable signal SCAN_EN, and two different scan clocks, SC2 and SC1. The last scan cycle occurs at time T1. During this last scan cycle, the test mode address is scanned in, the bit line mux decode 20 is enabled, and the address for the row decode 16 is shifted in. After the last scan cycle, scan enable signal SCAN_EN is brought low and followed, at time T2, by the clock CLK driven high. The data latched into each address and data buffer for the memory array 10 is recirculated from the previous cycle which was set during the last scan cycle. Consequently, the address used for the read cycle initiated by the rising edge of clock CLK at time T2 is that address last scanned in during the last scan cycle at time T1. During the entire clock high time between times T2 and T3, the word line which is selected is static and remains high. The self-resetting circuits normally enabled, which serve to bring the active row back low before the end of the cycle, are disabled, thus allowing the selected word line to remain high throughout the entire cycle between time T2 and time T3. The selected word line remains in a static high state until the falling edge of clock CLK which occurs at time T3. Moreover, the bit line circuits remain in a high impedance state and the bit line mux decode remains enabled, thus allowing test pads BTP and BCP and isolated terminal VDDWL to be used to force analog voltages on the bit lines and an analog voltage on the word line. As described above, voltages may also be sensed on the bit lines and currents forced and/or sensed as well. The length of time between time T2 and time T3 may be indefinitely long, thus affording sufficient time for even manually performed measurements.

When the clock CLK is brought low at time T3, the test cycle terminates and the immediately following clock pulse of clock CLK, which occurs at time T4, initiates a normal clock cycle. Of course, during such a normal clock cycle, the voltage level on the selected word line is still controllable by driving the terminal VDDWL to the desired voltage level, and the power supply level for the memory cells within the memory array 10 is also still configurable by driving the voltage on terminal VDDMX to the desired level. During the normal cycle, the bit line mux decode 20 is not enabled.

Figure 18:
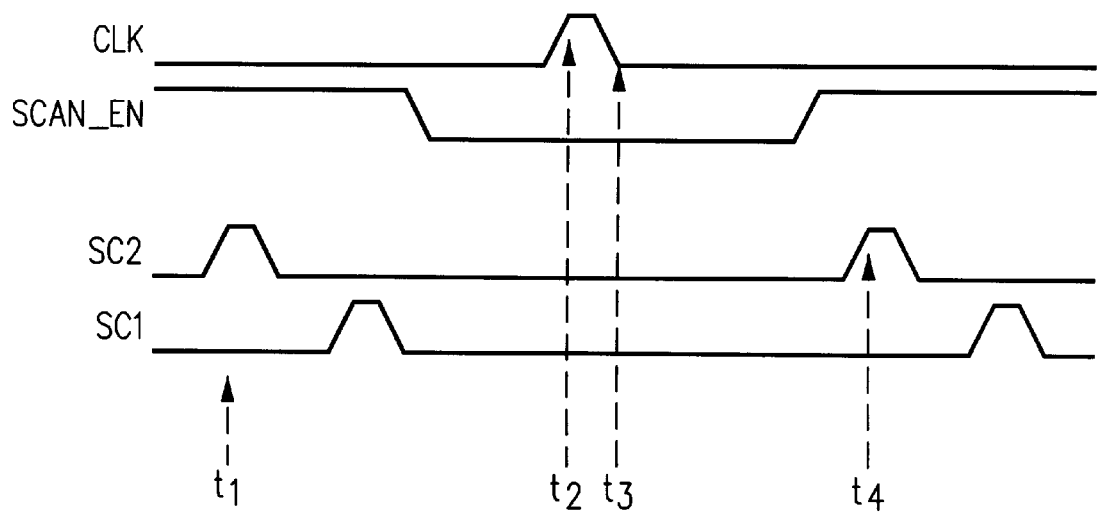

Referring now to FIG. 18, a timing diagram is shown which illustrates exemplary waveforms which conveniently select the local force test mode. Normally memory array 10 is addressed by address signals received from outside the memory array. For instance, in a microprocessor integrated circuit utilizing a memory array such as memory array 10, address inputs to the memory array 10 normally arrive from instruction fetch circuitry, or other external inputs from elsewhere within the microprocessor. To test such an imbedded memory array within a large integrated circuit such as a microprocessor, the address inputs for the memory array are preferably independently configurable, which allows much more thorough pattern testing and other characterization. In this case, the desired addresses and data are scanned into the integrated circuit and reach the appropriate registers in the last scan cycle at time T1. An appropriate test mode configuration bit is also set in this last scan cycle. The test mode signal LF (i.e., local force), which is set in the last scan cycle, is active for only one clock cycle CLK immediately after scan exit. Scan exit occurs on the falling edge of scan enable signal SCAN_EN and the first clock cycle occurring thereafter at time T2 utilizes the addresses and data signals previously set during the last scan cycle. This is accomplished by recirculating the input flip-flops to the requisite address and data buffers. The rising edge of clock signal CLK at time T2 initiates the read cycle and the falling edge of clock CLK at time T3 resets the local force control signal LF. Scan is enabled again by the rising edge of enable signal SCAN_EN after which (at time T4) the data is shifted out. During this first SC2 cycle at time T4, the input flip-flops recirculate one more time such that the address remains the same as that during the last clock CLK read.

This test mode allows the cache register inputs to be forced locally. Normally these inputs are generated by external logic elsewhere within the microprocessor integrated circuit, or from a built-in self test (BIST) controller. Such a BEST controller may be utilized in combination with the data retention tests described above as well as the various tests such as alpha particle susceptibility which only require an externally provided VDDMX voltage or an externally provided VDDWL voltage.

The three test modes described above may be controlled by two test mode control signals TST and LF. Test mode control signal LF is driven high (or is driven to an active state) to enable the local recirculation of the input registers to the memory array. This test mode control signal LF is typically activated for both a normal test cycle for the memory array as well as to enable the sense amplifier margin test described above. The second test mode control signal TST is driven active to enable the I–V tests which require the bit line circuits to adopt a high impedance state such as the DC characterization tests of the memory cell and to disable the self-resetting logic within the row decoder. The test mode control signal TST is also enabled to enter the sense amp margin test. Table 1 below sets forth the three combinations of test mode control signals which are used to enable, respectively, the three test modes described above.

TABLE 1

| Test Mode Control Signals | | Action Taken |
|---|---|---|
| TST | LF | Configuration of associated test mode: |
| 1 | 0 | DC characterization tests: test bit line mux decode enabled, column circuits forced into high impedance condition, row decode self-resetting logic disabled to allow static selected row |
| 0 | 1 | During first clock after scan exit, locally recirculate input registers from scan registers; test bit line mux decode disabled, column circuits in normal mode, row decoder self-resetting. |
| 1 | 1 | Sense amplifier margin test: test bit line mux decode enabled, column circuits in normal mode, row decoder self-resetting, locally recirculate input registers from scan registers. |

Processor and System Embodiments

Test methods and circuits of the present invention can be used in variety of circuits and devices incorporating semiconductor memory.

A wide variety of computer system configurations are envisioned, each embodying the above-described test circuits and testable using the methods in accordance with the present invention. For example, one such a computer system includes integrated circuit microprocessor with instruction, data and predecode caches, a memory subsystem (e.g., RAM), a display adapter, disk controller/adapter, various input/output interfaces and adapters, and corresponding external devices. Memory, adapters and interfaces are conventionally coupled to an integrated circuit microprocessor via busses.

A description of the well-known 13N-based algorithm is found in Decker, et al., Fault Modeling and Test Algorithm Development for Static Random Access Memories, in *Proceedings of the International Test Conference*, pp. 343–52 (November 1988), as well as in U.S. Pat. No. 5,640,509 issued Jun. 17, 1997 to Balmer, et al.

Cross-Reference

The present invention is related to subject matter disclosed in the following co-pending patent applications:

Exemplary row decoder circuits may be found in co-pending, commonly-assigned, concurrently-filed U.S. patent application Ser. No.: [unassigned, Attorney Docket No. M-5140 US], entitled "Register-Based Redundancy Circuit and Method for Built-In Self-Repair in a Semiconductor Memory Device" and naming Imtiaz P. Shaik, Dennis L. Wendell, Benjamin S. Wong, John C. Holst, Donald A. Draper, Amos Ben-Meir, and John G. Favor as inventors, which application is incorporated herein by reference in its entirety.

Exemplary row decoder circuits may also be found in co-pending, commonly-assigned, concurrently-filed U.S. patent application Ser. No.: [unassigned, Attorney Docket No. M-5141 US], entitled "Dual Comparator Circuit And Method For Selecting Between Normal And Redundant Decode Logic In A Semiconductor Memory Device" and naming Dennis L. Wendell and Benjamin S. Wong as inventors, which application is incorporated herein by reference in its entirety.

Exemplary row decoder circuits may also be found in co-pending, commonly-assigned, concurrently-filed U.S. patent application Ser. No.: [unassigned, Attorney Docket No. M-5151 US], entitled "Memory Block Select Using Multiple Word Lines To Address a Single Memory Cell Row" and naming Dennis Lee Wendell and John Christian Hoist as inventors, which application is incorporated herein by reference in its entirety.

Exemplary sense amplifier circuits may be found in co-pending, commonly-assigned, concurrently-filed U.S. patent application Ser. No.: [unassigned, Attorney Docket No. M-5150 US], entitled "Memory Interface Circuit Including Bypass Data Forwarding With Essentially No Delay" and naming John Christian Holst as inventor, which application is incorporated herein by reference in its entirety.

Exemplary scanning sense amplifier circuits useful for reading out an embedded memory array may be found in co-pending, commonly-assigned, concurrently-filed U.S. patent application Ser. No.: [unassigned, Attorney Docket No. M-5153 US], entitled "Scannable Sense Amplifier Circuit" and naming Dennis L. Wendell as inventor, which application is incorporated herein by reference in its entirety.

Exemplary bit line equilibration and recovery circuits may be found in co-pending, commonly-assigned, concurrently-filed U.S. patent application Ser. No.: [unassigned, Attorney Docket No. M-5167 US], entitled "Selective Bit Line Recovery In A Memory Array" and naming Dennis L. Wendell as inventor, which application is incorporated herein by reference in its entirety.

General Nomenclature and Terminology Usage

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are just as clear and much easier to quickly communicate details of circuit operation without becoming lost in needless prepositional phrases, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure, even though they are somewhat colloquial in style. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. Frequently logic signals are named in a fashion to convey which level is the active level. For example, CLKEN is commonly used to name an active-high clock enable signal, because the true polarity is implied in the name. Conversely, /CLKEN, CLKENB, CLKEN#, CLKEN*, CLKEN_L, CLKEN_C, or #CLKEN are commonly used to name an active-low clock enable signal, because one of the many common expressions indicating the complement polarity is used in the name. Complementary pairs of signals or node names, such as true and complement clock lines, and true and complement bit lines within a column of a memory array, are frequently named to clarify the polarity of both nodes or signals (e.g., BL3T and BL3C; BL6_T and BL6_C) and in other instances, only the complement polarity may be indicated in the names (e.g., CLK and CLK#). In still other cases, two "complementary" signals are both inactive at one state (e.g., inactive low), and only one is driven to an active level to convey the polarity of the signal. For example, two complementary address lines (e.g., A2T and A2C) are both inactive low during a quiescent portion of a cycle. Later, A2T is driven high to indicate that the received address A2 is high (A2=H). Alternatively, A2C is driven high to indicate that the address received is low (A2=L). It is to be appreciated by those skilled in the art that these and other similar phrases may be used to name the signals and nodes. The schematic diagrams and accompanying description of the signals and nodes should in context be clear.

Regarding power supplies, a single positive power supply voltage (e.g., a 3.3 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor (unless otherwise defined) means the same as being "pulled low" or "pulled to ground" by the transistor.

Generalizing somewhat, the first power supply terminal is frequently named "VDD", and the second power supply terminal is frequently named "VSS." Both terms may appear either using subscripts (e.g., $V_{DD}$) or not. Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC" (a historical term from bipolar circuits and frequently synonymous with a +5 volt power supply voltage, even when used with MOS transistors which lack collector terminals) and "GND" or just "ground.

An insulated gate field effect transistor (IGFET) transistor may be conceptualized as having a control terminal which controls the flow of current between a first current handling terminal and a second current handling terminal. Although IGFET transistors are frequently discussed as having a drain, a gate, and a source, in most such devices the drain is interchangeable with the source. This is because the layout and semiconductor processing of the transistor is frequently symmetrical. For an N-channel IGFET transistor, the current handling terminal normally residing at the higher voltage is customarily called the drain. The current handling terminal normally residing at the lower voltage is customarily called the source. A sufficient voltage on the gate (relative to the source voltage) causes a current to therefore flow from the drain to the source. The source voltage referred to in N-channel IGFET device equations merely refers to whichever drain or source terminal has the lower voltage at any given point in time. For example, the "source" of the N-channel device of a bi-directional CMOS transfer gate depends on which side of the transfer gate is at the lower voltage. To reflect this symmetry of most N-channel IGFET transistors, the control terminal may be deemed the gate, the first current handling terminal may be termed the "drain/source", and the second current handling terminal may be termed the "source/drain". Such a description is equally valid for a P-channel IGFET transistor, since the polarity between drain and source voltages, and the direction of current flow between drain and source, is not implied by such terminology. Alternatively, one current-handling terminal may arbitrarily deemed the "drain " and the other deemed the "source", with an implicit understanding that the two are not distinct, but interchangeable. It should be noted that IGFET transistors are commonly referred to as MOS-FET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOSFET should not be interpreted to literally specify a metal gate FET having an oxide dielectric.

Other Embodiments

As described above, the present invention is well-suited for memory arrays which are incorporated into stand-alone memory devices, and is particularly well suited to memory arrays incorporated within a larger integrated circuit, such as a microprocessor. Either is advantageously incorporated into a system having an external bus connected to other integrated circuits and sub-systems.

While the invention has been described in light of the embodiments discussed above, one skilled in the art will recognize that certain substitutions may be easily made in the circuits without departing from the teachings of this disclosure. For example, a variety of logic gate structures may be substituted for those shown, and still preserve the operation of the circuit. In particular, a NAND gate may be replaced by a NOR gate by appropriate polarity changes of the various signals, in accordance with DeMorgan's law. Moreover, an inverted output of a flip-flop may be used rather than the non-inverted output, again with appropriate polarity changes of the various signals. Also, many circuits using NMOS transistors may be implemented using PMOS transistors instead, as is well known in the art, provided the logic polarity and power supply potentials are reversed. In this vein, the transistor conductivity-type (i.e., N-channel or P-channel) within a CMOS circuit may be frequently reversed while still preserving similar or analogous operation.

While the invention has been described with respect to the embodiments set forth above, the invention is not necessarily limited to these embodiments. Accordingly, other embodiments, variations, and improvements not described herein are not necessarily excluded from the scope of the invention, which is defined by the following claims.

What is claimed is:

1. In an integrated circuit incorporating a static read/write memory array, a method of characterizing a memory cell within the memory array, the method comprising:

providing a multiplexer in the integrated circuit for coupling a pair of isolated terminals to a selected pair of complementary bit lines;

providing memory array support circuitry connected to the respective bit lines which presents a high-impedance to the selected pair of bit lines;

providing a row decoder for statically driving a selected word line to an externally controllable analog voltage;

applying a first selected and a selected second voltage to each of the pair of isolated terminals, thereby driving a first bit line of the selected pair of bit lines to the first selected voltage and a second bit line of the selected pair of bit lines to the second selected voltage;

ramping the externally controllable voltage through a particular voltage range; and measuring current flow from one of the bit lines into the selected memory cell.

2. The method as recited in claim 1 wherein the first selected voltage and the second selected voltage correspond to one of the selected bit lines being driven to a voltage level equal to that powering the selected memory cell, and the other selected bit line being driven to a voltage between ground and approximately one volt.

3. The method as recited in claim 1 further comprising:
   establishing the data state of the selected memory cell before presenting, ramping, and measuring.

4. In an integrated circuit incorporating a static read/write memory array, a method of characterizing a memory cell within the memory array, the method comprising:
   providing a multiplexer in the integrated circuit for coupling a pair of isolated terminals to a selected pair of complementary bit lines;
   providing memory array support circuitry connected to the respective bit lines which presents a high-impedance to the selected pair of bit lines;
   providing at least one isolated power supply terminal for the memory cells within the memory array so that the memory cells are powered to an externally controlled voltage;
   providing a row decoder for driving a selected word line;
   applying a first selected voltage and a second selected voltage to the pair of isolated terminals, thereby driving the selected pair of bit lines to the first selected voltage and the second selected voltage; and
   ramping the externally controllable voltage through a particular voltage range while measuring current flow from the selected memory cell into at least one of the selected bit lines.

5. The method as recited in claim 4 wherein the first selected voltage and the second selected voltage correspond to both bit lines being driven to ground.

6. The method as recited in claim 4 wherein the first selected voltage and the second selected voltage correspond to one of the bit lines being swept to a voltage between ground and a voltage equal to the externally controlled voltage.

7. An integrated circuit incorporating a static read/write memory array; the integrated circuit tested in response to a first selected voltage source, a second selected voltage source a third selected voltage source a ramped voltage source for providing a ramped voltage and a first current measuring device being coupled thereto; the integrated circuit characterized by measuring a current as a function of voltage, the integrated circuit comprising:
   first and second isolated terminals;
   a multiplexer for coupling the first and second isolated terminals to a selected pair of complementary bit lines, the first current measuring device being coupled to one of the first and second isolated terminals;
   memory array support circuitry connected to the bit lines which presents a high-impedance to a selected pair of bit lines;
   a third isolated terminal, wherein the power supply terminals of memory cells of the memory array are coupled to the third isolated terminal;
   a fourth isolated terminal; and
   a row decoder for driving a selected word line to an external voltage applied to the fourth isolated terminal, wherein the ramped voltage source is applied to one of four isolated terminals, the first, second, and third selected voltage sources each being coupled to a different one of the three isolated terminals not coupled to the ramped voltage supply.

8. The integrated circuit as recited in claim 7 further comprising:
   a test multiplexer decoder in the integrated circuit for decoding an address identifying the selected pair of complementary bit lines.

9. The integrated circuit as recited in claim 7 further comprising:
   a second current measuring device coupled to one of the first and second isolated terminals to which the first current measuring device is not coupled.

10. The integrated circuit as recited in claim 7 wherein:
   the first, second, third and fourth isolated terminals each comprises a C4 solder bump.

* * * * *